US010080320B2

(12) United States Patent
Nozawa

(10) Patent No.: US 10,080,320 B2
(45) Date of Patent: Sep. 18, 2018

(54) BULK COMPONENT SUPPLY SYSTEM AND BULK COMPONENT REPLENISHMENT METHOD

(71) Applicant: FUJI CORPORATION, Chiryu-shi (JP)

(72) Inventor: Mizuho Nozawa, Nukata-gun (JP)

(73) Assignee: FUJI CORPORATION, Chiryu-shi (JP)

( * ) Notice: Subject to any disclaimer, the term of this patent is extended or adjusted under 35 U.S.C. 154(b) by 538 days.

(21) Appl. No.: 14/428,498

(22) PCT Filed: Sep. 20, 2012

(86) PCT No.: PCT/JP2012/074106
§ 371 (c)(1),
(2) Date: Mar. 16, 2015

(87) PCT Pub. No.: WO2014/045378
PCT Pub. Date: Mar. 27, 2014

(65) Prior Publication Data
US 2015/0237772 A1 Aug. 20, 2015

(51) Int. Cl.
*H05K 13/02* (2006.01)
*H05K 13/00* (2006.01)
(Continued)

(52) U.S. Cl.
CPC ....... *H05K 13/021* (2013.01); *H05K 13/0084* (2013.01); *H05K 13/0404* (2013.01);
(Continued)

(58) Field of Classification Search
CPC ...... H05K 3/30; H05K 3/301; H05K 13/0015; H05K 13/0084; H05K 13/02;
(Continued)

(56) References Cited

U.S. PATENT DOCUMENTS 5,036,582 A * 8/1991 Usui ................. B23P 19/10
29/714
5,796,616 A * 8/1998 Hamuro ............ H05K 13/021
29/740
(Continued)

FOREIGN PATENT DOCUMENTS

CN 1914969 A 2/2007
JP 11046092 A * 2/1999
(Continued)

OTHER PUBLICATIONS

Machine translation description section of JPH11-64092 provided by EPO websire (Espacenet.com).*
(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57) ABSTRACT

A bulk component supply system which includes a bulk component supply device which is moved together with a mounting head; and a method for replenishing bulk components to that bulk component supply device are disclosed. A passage-equipped component case of a bulk component supply device which is moved together with a mounting head is removed, held by the empty one of case holding sections of a slide in the bulk head component case exchange region. Bulk components are replenished and a passage-equipped component case held on the other of the case holding sections is held on the mounting head. The slide is moved to a bulk component replenishment region, and components are automatically replenished from bulk component storage vessel to the passage-equipped component case received from the mounting head which is empty. After
(Continued)

replenishment, the slide is moved to a bulk component case exchange region.

6 Claims, 17 Drawing Sheets

(51) Int. Cl.
*H05K 13/04* (2006.01)
*H05K 13/08* (2006.01)

(52) U.S. Cl.
CPC ........ *H05K 13/08* (2013.01); *Y10T 29/53013* (2015.01); *Y10T 29/53178* (2015.01); *Y10T 29/53478* (2015.01)

(58) Field of Classification Search
CPC .. H05K 13/021; H05K 13/022; H05K 13/028; H05K 13/029; H05K 13/04; H05K 13/0404; H05K 13/0408; H05K 13/0413; H05K 13/0417; H05K 13/043; H05K 13/0434; H05K 13/0452; H05K 13/0478; H05K 13/08; Y10T 29/5303; Y10T 29/53061; Y10T 29/53174; Y10T 29/53178; Y10T 29/53191; Y10T 29/53252; Y10T 29/53261; Y10T 29/53313; Y10T 29/53378; Y10T 29/53478
USPC ......... 29/707, 714, 739, 740, 743, 757, 759, 29/771, 786, 809, 832
See application file for complete search history.

(56) References Cited

U.S. PATENT DOCUMENTS

| | | | |
|---|---|---|---|
| 6,195,876 B1* | 3/2001 | Koyama | H05K 13/028 29/33 J |
| 2006/0207089 A1* | 9/2006 | Maenishi | H05K 13/0452 29/832 |
| 2006/0254048 A1 | 11/2006 | Shimada | |

FOREIGN PATENT DOCUMENTS

| | | |
|---|---|---|
| JP | 11-317599 | 11/1999 |
| JP | 2000 22388 | 1/2000 |
| WO | WO 2005/072042 A1 | 8/2005 |

OTHER PUBLICATIONS

Office Action dated Aug. 9, 2016 in Japanese Patent Application No. 2014-536481 (with English translation).
Combined Chinese Office Action and Search Report dated Nov. 3. 2016 in patent application No. 201280075900.1 with English translation of Office Action and English translation of Categories of Cited Documents.
U.S. Appl. No. 14/428,543, filed Mar. 16, 2015, Nozawa.
International Search Report dated Oct. 30, 2012 in PCT/JP12/074106 Filed Sep. 20, 2012.

* cited by examiner

BULK COMPONENT SUPPLY SYSTEM AND BULK COMPONENT REPLENISHMENT METHOD

TECHNICAL FIELD

The present disclosure relates to a bulk component supply system which includes a bulk component supply device which is moved together with a mounting head which mounts bulk components on a circuit substrate, and a method for replenishing bulk components to that bulk component supply device.

BACKGROUND ART

In patent literature 1 below, a bulk component supply system in which a bulk component supply device which holds and supplies multiple electronic circuit components as bulk components in a loosely packed state consecutively one by one is moved together with suction nozzles relative to a circuit board is disclosed. For a component mounter device equipped with this bulk component supply system, a suction nozzle, and magazine and component storehouse are integrally configured, and are respectively provided at four locations at equal angle intervals on a head provided rotatably around an axis line parallel to the vertical direction. Magazines are equipped with a storage passage extending in the vertical direction and multiple bulk components are stored arranged in a line in the vertical direction such that they move to a component outlet under their own weight. The component storehouse houses electronic circuit components in a loosely packed state, is provided on the upper side of the magazine and replenishes bulk components, with the entry of the bulk components into the storage passage being facilitated by the movement in the vertical direction of a movable pipe. The suction nozzle/component storehouse integrated magazine is positioned relative to a component mounting location on a circuit board by the rotation of the head and the movement in the X-axis and Y-axis directions of the circuit board, and bulk components stored in the storage passage are mounted on the circuit board one by one. Multiple suction nozzle/component storehouse integrated magazines are held on a rack provided separately from the head, and a suction nozzle/component storehouse integrated magazine attached to the head is positioned at an exchange position specified in advance by the rotation of the head, and while this is returned to the rack by a magazine mounting mechanism provided on the rack, a different suction nozzle/component storehouse integrated magazine in which are stored bulk components which is held on a separate section of the rack is attached to the head, such that replenishment and so on of electronic circuit components is performed.

CITATION LIST

Patent Literature

Patent Literature 1
JP-A-2000-22388

SUMMARY

Problem to be Solved

The present disclosure, taking account of the above background circumstances, relates to improving the practicality of: a bulk component supply system which includes a bulk component supply device which is moved together with a mounting head; and a method for replenishing bulk components to that bulk component supply device.

Means for Solving the Problem

The above problems can be solved by a bulk component supply system comprising: (A) a bulk component supply device which is movable together with a mounting head for mounting bulk components on a circuit substrate, including: a bulk component case which houses electronic circuit components in a loosely packed state as bulk components, a component passage which arranges bulk components in a line and guides them to a component supply section, and a supply device use bulk component transfer device which transfers bulk components inside the bulk component case to a component passage; and (B) a bulk component case moving device to remove the bulk component case from the mounting head and move the same to a bulk component replenishment region; and wherein bulk components can be replenished to the bulk component case moved to the bulk component replenishment region. Included in circuit substrate are, for example, (a) a printed wiring board on which electronic circuit components have not yet been mounted; (b) a printed circuit board on one side of which electronic circuit components have been loaded and electrically connected, and on the other side of which electronic circuit components have not yet been mounted; (c) a substrate configured from a chip-equipped board on which a bare chip has been loaded; (d) a substrate on which is loaded an electronic circuit component provided with a ball grid array; and (e) a substrate which is not a flat board but which is three dimensional.

The passage-equipped component case may be with the bulk component case and component passage fixed to each other and removed from the mounting head, and at least one section of the supply device use bulk component transfer device may be removed from the mounting head together with the bulk component case. The entire bulk component supply device may be removed from the mounting head. Replenishment of bulk components to a bulk component case may be performed manually or automatically.

The above problems can also be solved by a bulk component replenishment method providing bulk components to a bulk component supply device which is movable together with a mounting head for mounting bulk components on a circuit substrate and which includes a bulk component case to house electronic circuit components in a loosely packed state as bulk components, a component passage which arranges bulk components in a line and guides them to a component supply section, and a supply device use bulk component transfer device which transfers bulk components inside the bulk component case to the component passage; wherein, with respect to one component replenishment section, at least two bulk component cases are provided, and while one bulk component case is attached to the mounting head and being used, replenishment of bulk components can be performed to the other bulk component case at the component replenishment section.

Effects

Various effects can be realized if replenishment of bulk components is performed after a bulk component case is removed from a mounting head and moved to a bulk component replenishment region. For example, component replenishment can be performed at a position away from the head moving region which is the region in which the mounting head is moved by the head moving device, and replenishment can be performed without interference with the mounting head and head moving device. Also, it is also easy to maintain replenishment space. According to the method of the present disclosure, it is possible to perform replenishment of the same type of bulk component as the bulk component being mounted by the mounting head without interrupting mounting. Also, one component replenishment section will suffice.

Example Forms

Below, several example forms are illustrated and described. Each form, the same as the claims, is divided into clauses, a numbers is attached to each clause, and disclosure is performed with reference to the numbers of other clauses where appropriate. This is simply to facilitate understanding and in no way restricts the combination of structural elements to an item described in each clause below.

(1) A bulk component supply system comprising: a bulk component supply device which is movable together with a mounting head for mounting bulk components on a circuit substrate, including: a bulk component case which houses electronic circuit components in a loosely packed state as bulk components, a component passage which arranges bulk components in a line and guides them to a component supply section, and a supply device use bulk component transfer device which transfers bulk components inside the bulk component case to a component passage; and a bulk component case moving device to remove the bulk component case from the mounting head and move the same to a bulk component replenishment region; and wherein bulk components can be replenished to the bulk component case moved to the bulk component replenishment region.

There may be one or multiple bulk component supply devices. In the case of multiple, the bulk components which each bulk component supply device supplies may be the same type or different types.

(2) The bulk component supply system according to clause (1), further including: a bulk component storage vessel which stores bulk components, has a larger capacity than the bulk component case, and is provided in the bulk component replenishment region; and a component replenishment device which replenishing bulk components from the bulk component storage vessel to the bulk component case moved to the bulk component replenishment region.

If a bulk component storage vessel and component replenishment device are provided, replenishment of bulk components to a bulk component case can be performed multiple times automatically. One time suffices for component storage work to a bulk component storage vessel with respect to multiple times of component replenishment to a bulk component case, and compared to not providing a bulk component storage vessel and an operator replenishing bulk components to a bulk component case, the frequency of replenishment can be reduced, and the workload on the operator can be reduced.

Also, if the amount of bulk components stored in the bulk component case is large, a small number of component replenishments to a bulk component case will suffice, but the movement time until stored components are used up becomes long, and blackening occurs. In contrast, according to the bulk component supply system disclosed in this clause, because bulk components are replenished automatically, even if the component housing capacity of a bulk component case is reduced and the number of replenishments increased, there is no increase in the workload of the operator, and an amount of bulk components which can be used up without blackening can be stored in the bulk component case, and blackening can be avoided by performing replenishment each time bulk components run out.

(3) The bulk component supply system according to clause (2), further including: a replenishment amount detection device which detects the amount of bulk components replenished to the bulk component case from the bulk component storage vessel; and an automatic replenishment stopping device which stops replenishment of bulk components to the bulk component case from the bulk component storage vessel at the component replenishment device when the replenishment amount detected by the replenishment amount detection device reaches a specified amount.

Detection of the replenishment amount may be performed, for example, based on weight detection of the bulk component case or the bulk component storage vessel, or the detection of the height level of the layer of bulk components stored therein, or the detection of the operation amount of the component replenishment device.

The specified amount may be specified, for example, at an amount at which blackening of bulk components stored in the bulk component case, or defects of component transfer by the supply device use bulk component transfer device, do not occur.

(4) The bulk component supply system according to clause (2) or clause (3), further including: a connecting device which replenishes bulk components by connecting a component inlet of a bulk component case moved to the bulk component replenishment region and a component outflow path which outflows bulk components of the bulk component storage vessel.

The component outflow path is closed except for during component replenishment to prevent outflowing and so on of bulk components.

(5) The bulk component supply system according to clause (4), further including: a storage vessel use bulk component transfer device which transfers the bulk components in the bulk component storage vessel to the component outflow path.

Replenishment of bulk components to the bulk component case is performed accurately.

(6) The bulk component supply system according to clause (5), wherein the storage vessel use bulk component transfer device includes: a rotating disk provided adjacent to a side wall of the bulk component storage vessel which is rotatable around an axis line and which is equipped with multiple magnets arranged along a circumference with the axis line at the center; a rotating disk driving device for rotating that rotating disk; and a scraping off section which scrapes off bulk components, which have arrived at the entrance of the component outflow path after being pulled by each of the multiple magnets along with the rotation of the rotating disk, to the entrance.

The magnets may be permanent magnets or electromagnets. According to the magnets and scraping off section, replenishment can be performed without a concern about subjecting the bulk components to a large force and without damaging the bulk components.

(7) The bulk component supply system according to any of the clauses (1) to (6), wherein the bulk component supply system includes multiple of the bulk component cases, and wherein the bulk component case moving device includes a first case holding section which holds the bulk component case removed from the mounting head and a second case holding section which holds the bulk component case to which bulk components were replenished; wherein the bulk component case is received from the mounting head to the first case holding section and the bulk component case is delivered to the mounting head from the second case holding section.

The present bulk component supply system can be an item in which, for example, the bulk component case moving device includes a number one moving device which moves number one case holding section and a number two moving device which moves number two case holding section, or may be configured as disclosed in the next clause. In the former case, the respective role of the two case holding sections is decidedly fixedly as receiving and delivering of the bulk component case, with component replenishment being performed with respect to this.

(8) The bulk component supply system according to any of the clauses (1) to (6), wherein the bulk component case moving device includes: a movable member which is equipped with two case holding sections which hold the bulk component case and which is movable to the bulk component replenishment region and the bulk component case exchange region; a movable member driving device which moves that movable member to the bulk component replenishment region and the bulk component case exchange region; and a bulk component case exchange device which, at the bulk component case exchange region, receives and holds the bulk component case from one of the two case holding sections on the mounting head, and delivers the bulk component case to the other of the two case holding sections on the mounting head.

The bulk component supply system of this clause can be thought of as a form of the bulk component supply system of clause (7). In this case, the two case holding sections function alternately as the number one case holding section and number two case holding section of the bulk component supply system of clause (7).

If there are two case holding sections, at the same time as one of the two bulk component cases being attached to the mounting head and supplying bulk components, replenishment of bulk components can be performed at the other bulk component case, and component replenishment can be performed without interrupting mounting for the sake of replenishment and while curtailing drops in the mounting performance. In particular, because the two case holding sections are moved by one movable member and movable member driving device, the system can be configured simply and at a low cost.

(9) The bulk component supply system according to clause (8), wherein the movable member, the movable member driving device, and the bulk component case exchange device are supported integrally on an exchange device main body to configure a bulk component case exchange unit, and that bulk component case exchange unit can be attached/removed to/from the main body of the component mounter device provided with the bulk component supply system.

With this, handling of the movable member, the movable member driving device, and the bulk component case exchange device becomes easy.

(10) The bulk component supply system according to clause (9) in which the bulk component case exchange unit includes an exchange unit control computer which controls that bulk component case exchange unit, and a connecting section (connector) which connects that exchange unit control computer to the mounter device control computer which controls the component mounter device.

(11) The bulk component supply system according to any of the clauses (8) to (10), wherein the two case holding sections are provided lined up in a direction parallel to the moving direction of the bulk component cases by the bulk component case moving device, and wherein the bulk component supply system further includes: a bulk component storage vessel with a capacity larger than the bulk component case which stores bulk components and which is provided in the bulk component replenishment region; and a bulk component storage vessel moving device which moves that bulk component storage vessel to a position corresponding to one of the two case holding sections and to a position corresponding to the other of the two case holding sections.

The bulk component supply system of this clause is an item in which the bulk component storage vessel moving device is also used as the bulk component case moving device, but as a different form, it is also to use the bulk component storage vessel moving device instead of the bulk component case moving device. For example, providing the two case holding sections statically, and on the one hand performing exchange of bulk component cases between both case holding sections by the movement of the mounting head, and by performing replenishment of bulk components to a bulk component case being held by one of the two case holding sections by moving the bulk component storage vessel from a retract position to a replenishment position by bulk component storage vessel moving device.

By sharing the use of bulk component storage vessel moving device and bulk component case moving device, device costs can be reduced by, for example, either of the moving devices being an item with each of the bulk component storage vessel and movable member stopped at two positions, and by the stopping positions being decided mechanically by stoppers or the like, and using an electric motor and so on which does not use a stopping position control function or an air cylinder as the driving force. Also, it is possible to position the two case holding sections selectively with respect to the bulk component storage vessel by bulk component case moving device without providing a bulk component storage vessel moving device, but against the moving region of the movable member becoming longer, the moving region of the movable member becomes shorter by the shared use of the bulk component storage vessel moving device, and the bulk component supply system can be made compact. It should be noted that the embodiment does not exclude a form which provides only a bulk component case moving device.

(12) The bulk component supply system according to any of the clauses (1) to (11), wherein the bulk component case includes a component case related information holding section which holds component case related information including information related to at least the type of that bulk component case, and wherein the bulk component supply system further includes a component case/component housing body information acquisition device which acquires: (a) component case related information of the component case related information holding section; and (b), with a component housing body which houses bulk components supplied to the bulk component case equipped, information of a component housing body related information holding section which holds component housing body related information including information on at least the type of bulk component housed in the component housing body.

Because many component housing body related information holding sections are configured from barcodes, two-dimensional codes, and so on, it is desirable for the component case/component housing body information acquisition device to be a code reader such as a barcode reader or two-dimensional code reader. However, it is also possible to use another information acquisition device such as RFID (Radio Frequency Identification) which uses RF tags and an RFID reader-writer.

The form of this clause and the next clause is effective when bulk components are supplied directly to the bulk component case from the component housing body.

(13) The bulk component supply system according to clause (12), further including at least one of: a component case/component housing body not appropriate notification device which provides a notice when the component case related information and the component housing body related information acquired by the component case/component housing body information acquisition device is not appropriate; and a supply prevention device which prevents supply of bulk components to the bulk component case from the component housing body when the component case related information and the component housing body related information acquired by the component case/component housing body information acquisition device is not appropriate.

If both a supply prevention device and a component case/component housing body not appropriate notification device are provided, as well as accurately preventing the supply of inappropriate bulk components to a bulk component case, an operator can understand the reason for the supply prevention.

(14) The bulk component supply system according to any of the clauses (2) to (6), wherein the bulk component storage vessel is equipped with a storage vessel related information holding section which holds storage vessel related information including at least one of: (a) storage vessel identification information by which it is possible to individually identify the bulk component storage vessel itself; (b) storage vessel type information which is information of the type of the bulk component storage vessel itself; and (c) information of the type of the bulk component stored in the bulk component storage vessel; and wherein the bulk component supply system further includes a storage vessel/component housing body information acquisition device which can acquire: (a) storage vessel related information of that storage vessel related information holding section; and (b), with a component housing body which houses bulk components which should be supplied to the bulk component storage vessel equipped, information of a component housing body related information holding section which holds component housing body related information including information on at least the type of bulk component housed in that component housing body.

When bulk components are supplied to a bulk component case from a component housing body via a bulk component storage vessel also, the same as when they are supplied directly to a bulk component case, it is necessary to prevent the supply of inappropriate bulk components to the bulk component storage vessel from the component housing body, and the descriptions for the above clause (12) and clause (13) also apply to this clause and the next clause.

(15) The bulk component supply system according to clause (14), further including at least one of: a storage vessel/component housing body not appropriate notification device which provides a notice when the storage vessel related information and the component housing body related information acquired by the storage vessel/component housing body information acquisition device is not appropriate; and a supply prevention device which prevents supply of bulk components to the bulk component storage vessel from the component housing body when the storage vessel related information and the component housing body related information acquired by the storage vessel/component housing body information acquisition device is not appropriate.

(16) The bulk component supply system according to any of the clauses (2) to (6), (14), or (15) wherein the bulk component storage vessel is equipped with a storage vessel related information holding section which holds storage vessel related information including at least one of: (a) storage vessel identification information by which it is possible to individually identify the bulk component storage vessel itself; (b) storage vessel type information which is information of the type of the bulk component storage vessel itself; and (c) information of the type of the bulk component stored in the bulk component storage vessel; wherein the bulk component case is equipped with a component case related information holding section which holds component case related information including at least one of: (d) component case identification information which can individually identify the bulk component case itself; (e) information of the type of the bulk component case itself; and (f) information of the type of bulk components already housed in that bulk component case; wherein the bulk component supply system further includes a storage vessel/component case information acquisition device which acquires: storage vessel related information of that storage vessel related information holding section; and component case related information of that component case related information holding section.

It is possible to have an item in which information is read by a code reader for the storage vessel related information holding section and the component case related information holding section, but because in many cases both are manufactured by the manufacturer of the bulk component supply system, it is also possible to have an information holding section for which rewriting of information is possible such as RF tags. In particular, as in the bulk component supply system of clause (9) and clause (10) above, the use of RF tags or the like is easy and convenient for a form in which a device related to the exchange of bulk component cases which includes a bulk component storage vessel and case holding section which is made into a unit, and where that unit includes an exchange unit control computer connected to a mounter device control computer.

(17) The bulk component supply system according to clause (16), further including at least one of: a storage vessel/component case not appropriate notification device which provides a notice when the storage vessel related information and the component case related information acquired by the storage vessel/component case information acquisition device is not appropriate; and a replenishment prevention device which prevents replenishment of bulk components to the bulk component case from the bulk component storage vessel when the storage vessel related information and the component case related information acquired by the storage vessel/component case information acquisition device is not appropriate.

If both a replenishment prevention device and a storage vessel/component case not appropriate notification device are provided, as well as accurately preventing the replenishment of inappropriate bulk components to a bulk component case, there is the benefit that an operator can understand the reason for the replenishment prevention.

(18) The bulk component supply system according to any of the clauses (1) to (17), wherein the bulk component case is equipped with a component case related information holding section which holds component case related information including at least one of: (a) component case identification information which can individually identify the bulk component case itself; (b) information of the type of the bulk component case itself; and (c) information of the type of bulk components already housed in that bulk component case; wherein the mounting head is equipped with a component case related information acquisition device which acquires component case related information of the component case related information holding section; and wherein the bulk component supply system further includes at least one of: an unplanned component case notification device which provides a notice when the component case related information acquired from the component case related information acquisition device is different to the planned component case related information; and a mounting operation prohibition section which prohibits component mounting operation of the component mounter device provided with the bulk component supply system when the component case related information acquired from the component case related information acquisition device is different to the planned component case related information.

If the configuration disclosed in the above clause (13), clause (15), clause (17) and so on is used, there is the benefit that performing supply or replenishment of inappropriate bulk components can be prevented at an early stage, but even with only the configuration of this clause, it is possible to prevent at the final stage a component case which has different component case related information from the planned component case related information from being mounted on the mounting head.

(19) The component mounter device according to clause (18), further including: a required bulk component type acquisition section which, based on a program for the mounting of electronic circuit components on a circuit substrate, acquires the type of the bulk component which is the type required to run that program; and a judgment section which performs a judgment that the component case related information is different to the planned component case related information when the type of bulk component acquired by the component case related information acquisition device is inappropriate.

(20) A bulk component replenishment method providing bulk components to a bulk component supply device which is movable together with a mounting head for mounting bulk components on a circuit substrate and which includes a bulk component case to house electronic circuit components in a loosely packed state as bulk components, a component passage which arranges bulk components in a line and guides them to a component supply section, and a supply device use bulk component transfer device which transfers bulk components inside the bulk component case to the component passage; wherein, with respect to one component replenishment section, at least two bulk component cases are provided, and while one bulk component case is attached to the mounting head and being used, replenishment of bulk components can be performed to the other bulk component case at the component replenishment section.

The characteristics of the bulk component supply system disclosed in each of the clauses (1) to (19) can also be applied to the bulk component replenishment method of this clause.

DESCRIPTION OF EMBODIMENTS

Below, embodiments are described with reference to the figures. It should be noted that the embodiments are non-limiting and can be embodied in various changed forms based on the knowledge of someone skilled in the art, such as the forms given in the above section "Example Forms."

Figure 1:
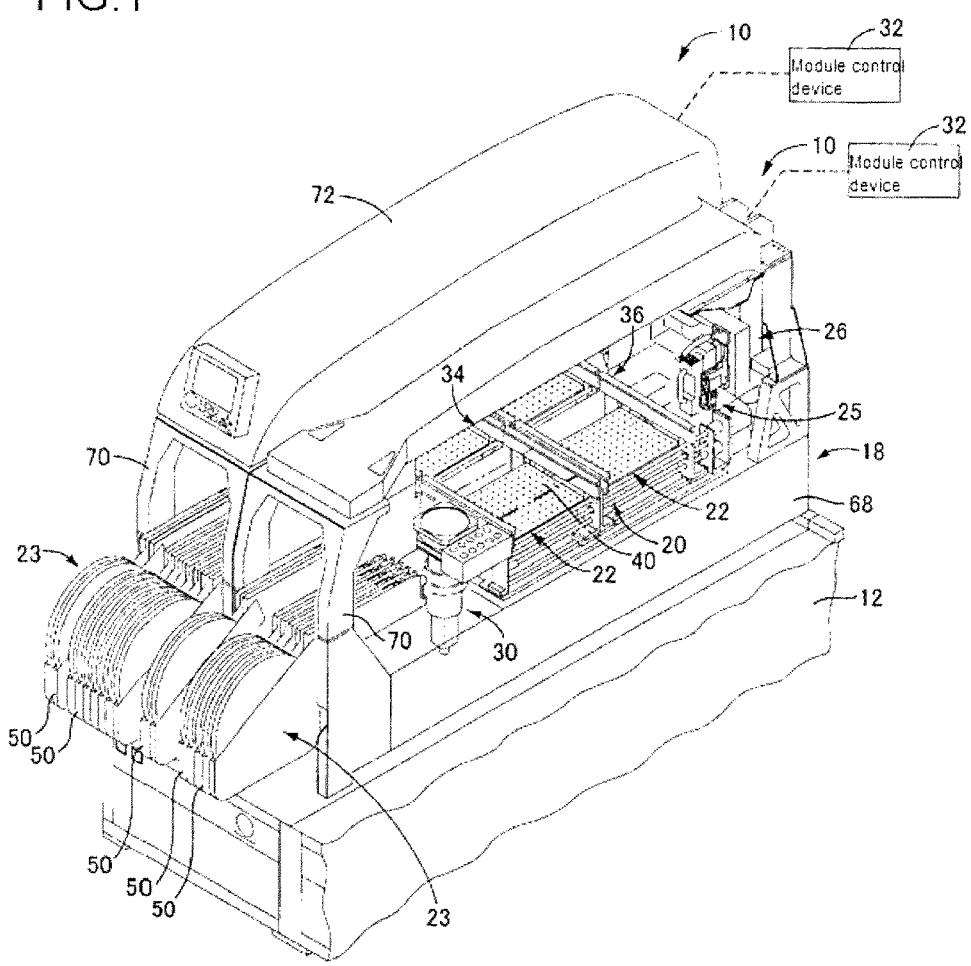
FIG. 1 This is a perspective view showing a section of an electronic circuit component mounting line equipped with multiple mounter modules which are equipped with the bulk component supply system which is one embodiment.

Shown in FIG. 1 are multiple mounter modules 10 which form component mounter devices which are one embodiment. These mounter modules 10 are arranged and fixed in a line adjacent to each other on top of a shared single body base 12 to configure a mounting line. Multiple mounter modules 10 divide and perform the mounting of electronic circuit components to a circuit substrate.

With regard to mounter module 10, details are disclosed, for example, in JP-A-2004-104075, and the sections except those sections which relate to the present embodiment are described simply below. Each mounter module 10 is, in the present embodiment, as shown in FIG. 1, equipped with module main body 18 which forms the main body of the component mounter device, board conveyance device 20 which forms the substrate conveyance device, board holding device 22 which forms the substrate holding device, component supply device 23, bulk component supply system 24 (refer to FIG. 5), mounting head 25, head moving device 26 which forms the device which applies relative movement, reference mark imaging device 28 (refer to FIG. 4), component imaging device 30, and module control device 32.

Board conveyance device 20, in the present embodiment, is equipped with two board conveyors 34 and 36, and conveys circuit board 40 which is a type of circuit substrate in a horizontal direction which is a direction parallel to the direction in which multiple mounter modules 10 are lined up. In this embodiment, "circuit board" is used as a general term for printed wiring boards and printed circuit boards. Board holding device 22 is provided on each of the two board conveyors 34 and 36 on module main body 18, and although omitted from the figure, each is equipped with a supporting member for supporting circuit board 40 from below and a clamping member for clamping the edge section on each side in a direction parallel to the conveyance direction of circuit board 40, and holds circuit board 40 with the component mounting surface onto which electronic circuit components are mounted in a horizontal orientation. In this embodiment, the conveyance direction of circuit board 40 by board conveyance device 20 is the X-axis direction, or the left-right direction; and the Y-axis direction, or the front-rear direction, is in a flat plane parallel to the component mounting surface of circuit board 40 held in board holding device 22 and is perpendicular to the X-axis direction in that horizontal plane.

Figure 2:
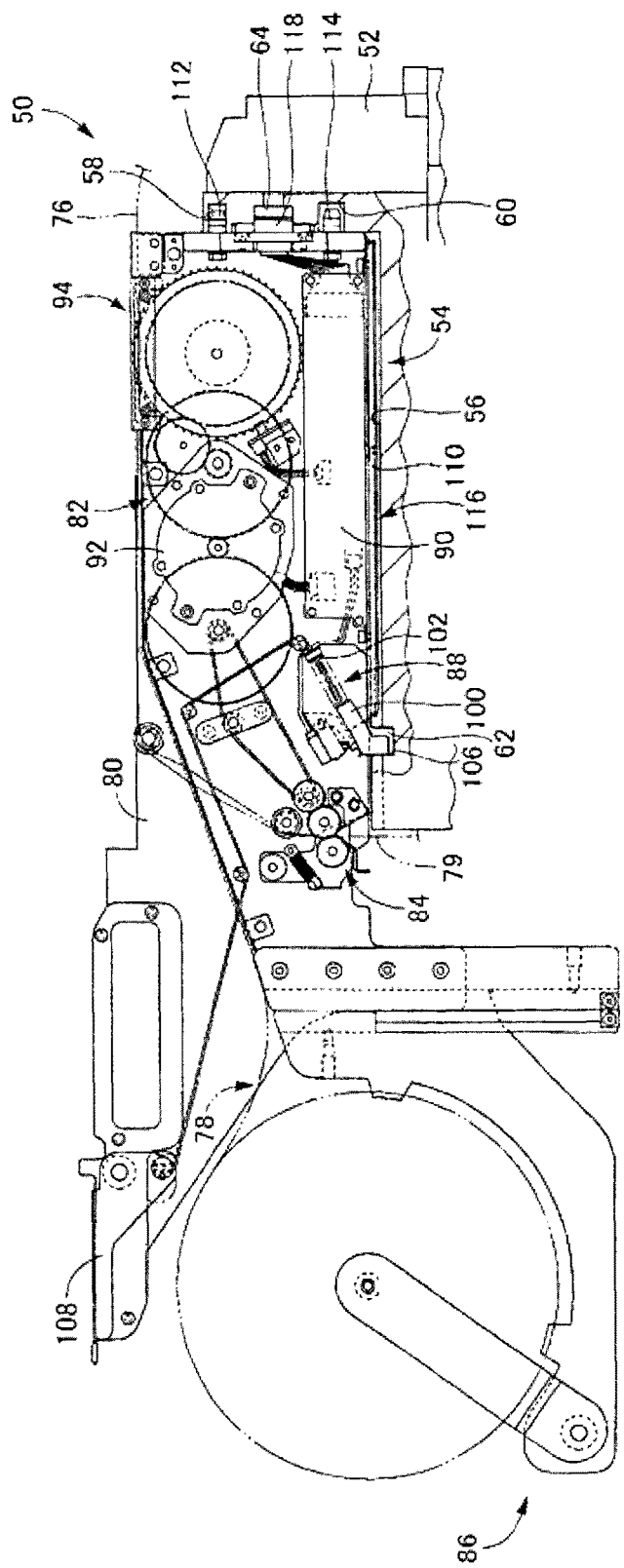
FIG. 2 This is a side view (partial cross section) showing the tape feeder of the component supply device of the above mounter module.

This component supply device 23 supplies electronic circuit components by multiple tape feeders 50 which form arranged-component feeders. These tape feeders 50, as shown in FIG. 2, are detachably attached to component supply table 52. Multiple installation sections 54 are provided on the front of component supply table 52. These installation sections 54, in the present embodiment, are each equipped with groove 56 extending in the front-rear direction (the left-right direction in FIG. 2), pair of positioning holes 58 and 60, and groove 62 parallel to the left-right direction (the direction coming straight up out of the page in FIG. 2); and are provided regularly spaced on the component supply table 52 separated by an appropriate gap in a direction parallel to the left-right direction. Also provided on component supply table 52 is connector 64, in the section between each positioning hole 58 and 60 of the multiple installation sections 54. It should be noted that, with regard to the overall mounter module 10, the side on which component supply device 23 is provided in the Y-axis direction is the front side or the facade; but with regard to component supply table 52, tape feeders 50, and the bulk component case exchange unit described below, conversely, in the Y-axis direction, the board conveyance device 20 side is the front and the component supply device 23 side is the rear.

Figure 3:
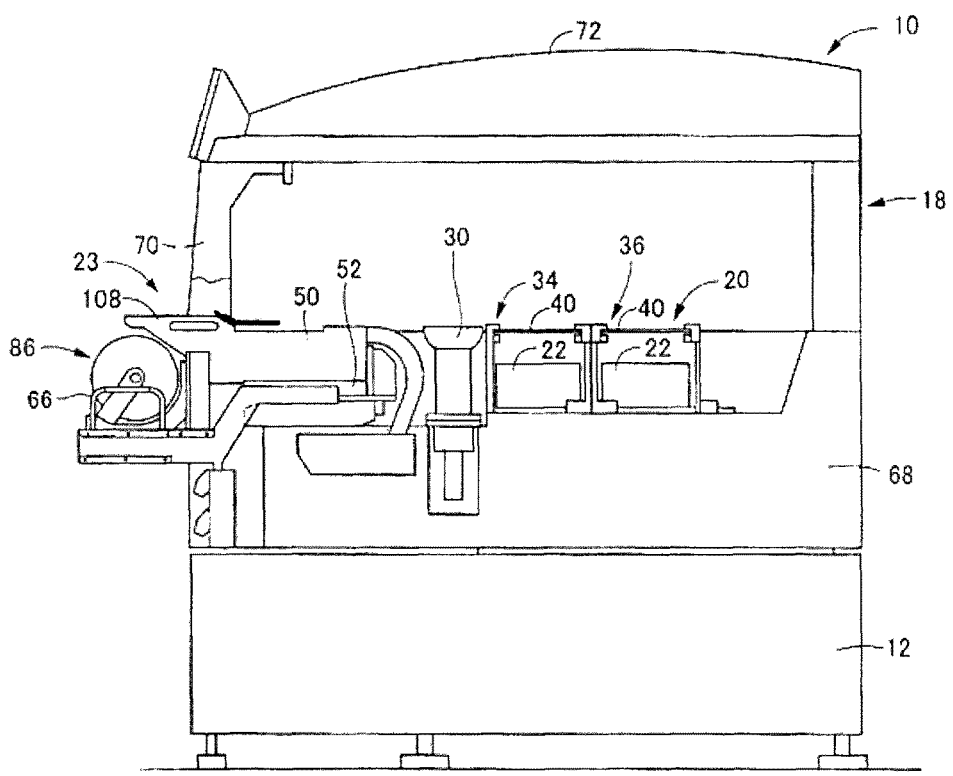
FIG. 3 This is a side view showing the above mounter module.

On component supply table 52, handles 66 are provided at the respective ends in the left-right direction of the rear section (handle 66 at one end is shown in FIG. 3), and component supply table 52 is attached and removed to/from base 68 of module main body 18 by an operator, and is fixed to base 68 in an attached state. In that state, the front-rear direction of component supply table 52 is parallel to the Y-axis direction, and the left-right direction is parallel to the X-axis direction; the front section which is the section provided with installation sections 54 of component supply table 52 is positioned in a space surrounded by column 70 of module main body 18 and cover 72 (hereafter referred to as space inside the module), and the rear section protrudes outside module main body 18. Installation sections 54 may be provided on base 68 such that a section of base 68 is made to be the component supply table.

Tape feeder 50 has the same kind of configuration as the feeder disclosed in JP-A-2004-47951 and is described simply below. Respective electronic circuit components are held by component holding tape 76, and supplied as taped components 78 in multiple tape feeders 50. Multiple of one type of electronic circuit component are held in component holding tape 76 arranged in a line and spaced at regular intervals and are covered by cover tape 79. transfer device 82, cover tape peeling device 84, component storage device 86, engaging device 88, and tape feeder control device 90 are provided on feeder main body 80 which is the main body of tape feeder 50 (refer to FIG. 2).

Transfer device 82 has electric motor 92 as a driving source, and transfers taped components 78 a predetermined distance each time, which in the present embodiment is a distance equal to the holding interval of the electronic circuit component of component holding tape 76, such that electronic circuit components which are the arranged components held in component holding tape 76 are removed from component holding tape 76 and positioned one by one at the component takeout position. The component takeout position is set at the front end of feeder main body 80 which is an end in the lengthwise direction or the front-rear direction; this section configures component supply section 94, and electronic circuit components are supplied from component supply section 94 consecutively one by one. In the present embodiment, electric motor 92 is configured from a servo motor with an encoder. The servo motor is an electric rotational motor for which the rotational angle can be controlled accurately, but a stepping motor may be used instead of a servo motor.

Engaging device 88, with engaging member 100 being engaged with side surface 106 of groove 62 provided on component supply table 52 by the biasing of compression coil spring 102, fixes tape feeder 50 to component supply table 52. This fixing is released by engaging member 100 being separated from side surface 106 against the biasing of spring 102 by lever 108 which forms an operating member being operated by an operator. The coil spring is a spring which forms an elastic member which is a kind of biasing means.

Tape feeder 50 is engaged with groove 56 of installation section 54 by rail 110 provided on the bottom surface of feeder main body 80, and, as well as positioning protrusions 112 and 114 provided on the front of feeder main body 80 being engaged with positioning holes 58 and 60, is fixed to component supply table 52 by engaging device 88. By this, as well as tape feeder 50 being positioned in an orientation in which the lengthwise direction is parallel to the Y-axis direction and the left-right direction or the widthwise direction is parallel to the X-axis direction, tape feeder 50 is held in a state which prevents it from rising up from component supply table 52. In the present embodiment, rail 110, positioning protrusions 112 and 114, and engaging device 88 configure tape feeder attachment device 116 which forms the arranged-component feeder attachment device, and in an attached state, the front of tape feeder 50 is positioned inside a space inside the module, and lever 108 and component storage device 86 are positioned outside the space inside the module.

Connector 118 is also provided on feeder main body 80 on the front thereof and is connected to connector 64 of component supply table 52. By this, communication can be performed between tape feeder control computer 120 which forms the main part of tape feeder control device 90 and module control computer 122 (refer to FIG. 15) which forms the main part of the module control device 32, and electric power can be supplied to tape feeder 50. Electric motor 92 is controlled by tape feeder control device 90.

Figure 4:
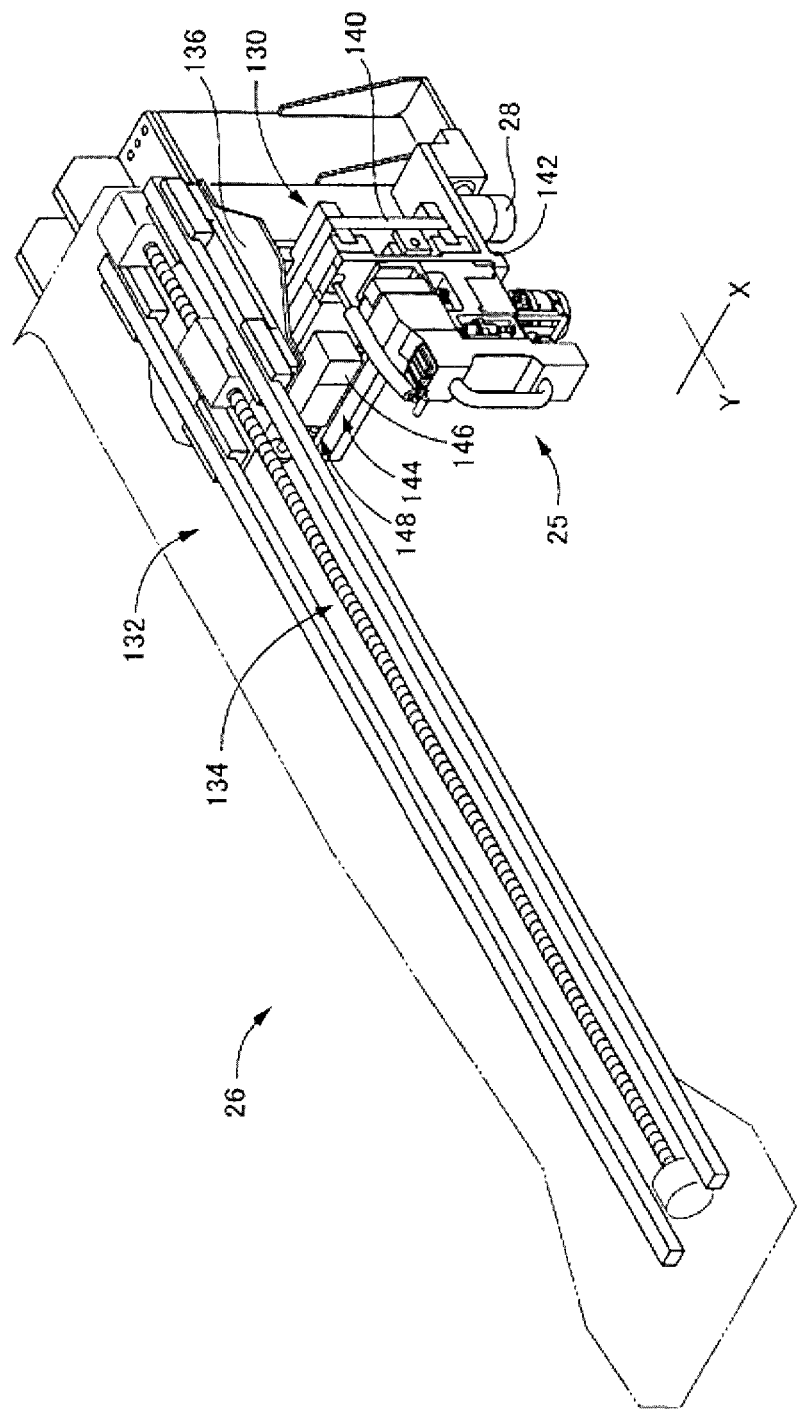
FIG. 4 This is a perspective view showing the mounting head and head moving device of the above mounter module.

The head moving device 26, as shown in FIG. 4, is equipped with X-axis direction moving device 130 and Y-axis direction moving device 132. Y-axis direction moving device 132 is equipped with linear motor 134 provided on module main body 18 straddling the component supply section of component supply device 23 (the section configured from component supply section 94 in the case in which tape feeders 50 are attached to all the installation sections 54 of component supply table 52) and two board holding devices 22, and Y-axis slide 136 acting as a moving member which forms the movable member can be moved to any position in the Y-axis direction.

X-axis direction moving device 130 is provided on Y-axis slide 136, and, as well as moving in the X-axis direction with respect to Y-axis slide 136, is equipped with: a first and a second X-axis slides 140 and 142 acting as movable members which form the movable members moved respectively relatively in the X-axis direction; and X-axis slide moving device 144 (in FIG. 4, X-axis slide moving device which moves the second X-axis slide 142 is shown) for moving each of those slides 140 and 142 in the X-axis direction. The two X-axis slide moving devices, as shown by X-axis slide moving device 144, for example, include electric motor 146 which forms the driving source and transfer screw mechanism 148 which includes a screw axis and nut, with X-axis slides 140 and 142 being able to be moved to any position in the X-axis direction, and the second X-axis slide 142 being able to be moved to any position within a horizontal movement plane. A ball screw mechanism is suitable as a transfer screw mechanism. The same is also true for other transfer screw mechanisms described below. The head moving device may have the Y-axis direction moving device provided on the X-axis slide.

The mounting head 25 is detachably loaded on the second X-axis slide 142, and is moved with respect to board holding device 22 according to the movement of the second X-axis slide 142, and can be moved to any position in the head moving region which is the moving region straddling the component supply section of component supply device 23 and the two board holding devices 22.

Figure 5:
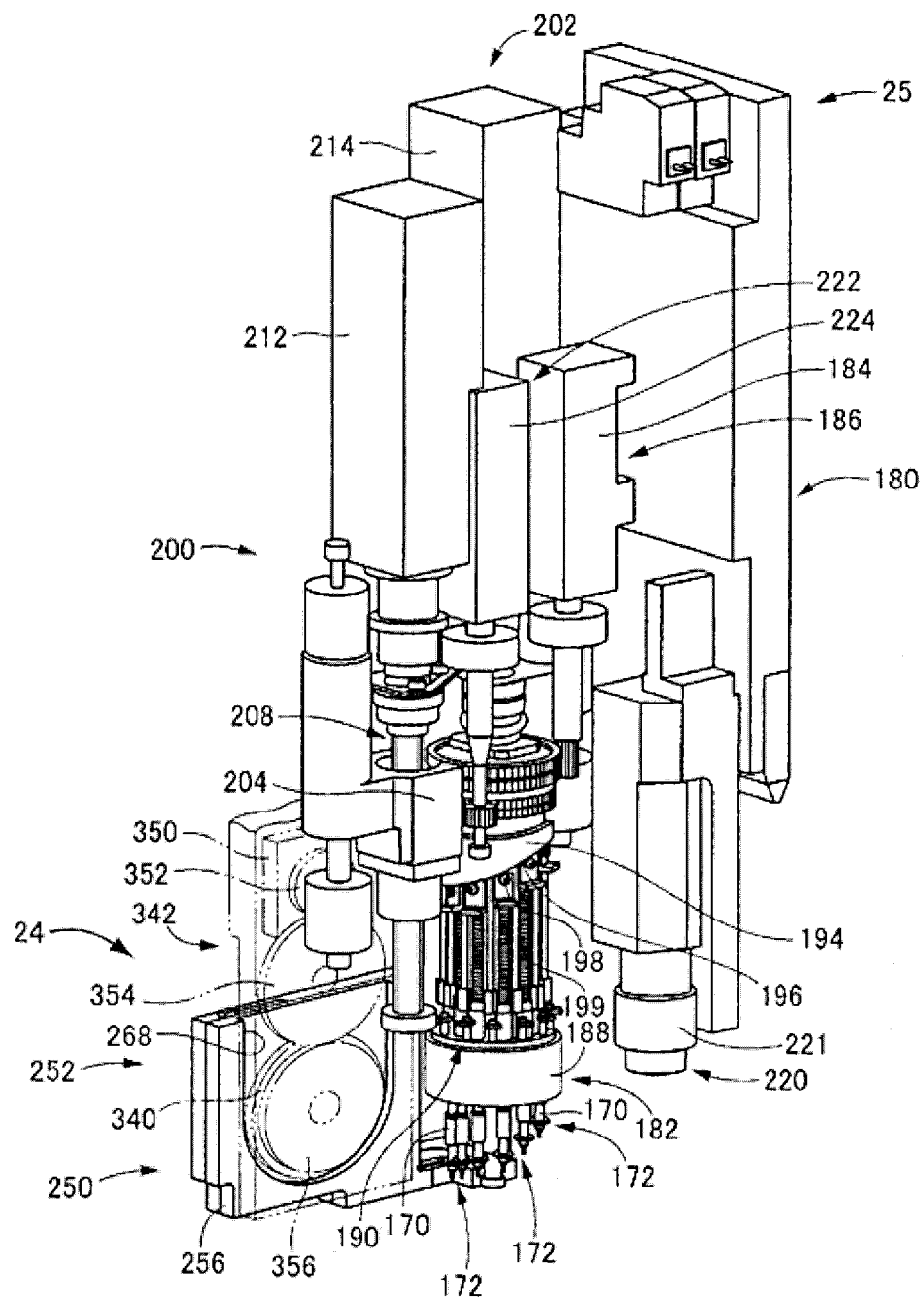
FIG. 5 This is a perspective view showing the above mounting head.

Mounting head 25 holds electronic circuit components by suction nozzles. Multiple types of mounting heads with different quantities of nozzle holders for holding a suction nozzle are prepared as mounting head 25, and one is selectably attached to the second X-axis slide 142. Mounting head 25 shown in FIG. 5 is equipped with multiple nozzle holders 170, for example three or more, and in the example shown in the figure, twelve such that a maximum of twelve suction nozzles 172 can be held.

The reference mark imaging device 28, as shown in FIG. 4, is loaded on the second X-axis slide 142, is moved together with the mounting head by head moving device 26, and captures images of reference marks (omitted from the figure) provided on circuit board 40. Also, the component imaging device 30, as shown in FIG. 1, is provided at a fixed position on the section between board conveyance device 20 of base 68 and component supply device 23, and captures images of an electronic circuit component which forms the imaging target object from below.

Described below is mounting head 25. Mounting head 25, although not yet made public, is disclosed in detail in the specifications of Japanese Patent Application 2011-206452 made by the same applicant as this application, and the sections except those sections which relate to the present embodiment are described simply below. As shown in FIG. 5, rotating body 182 is supported on head main body 180 of mounting head 25 such that it can be rotated about its own vertical axis line, and can be rotated to any angle in both forward and reverse directions about a vertical axis line by rotational driving device 186 which has electric motor 184 as its driving source.

The twelve nozzle holders 170, are each engaged at twelve positions at suitably spaced intervals on the circumference centered around the rotational axis line of rotating body 182 of the outer section of holder holding section 188 of rotating body 182, which for the present embodiment is twelve positions spaced at equal angles, and can be moved relative to the axis direction and can be rotated about their own axis line in an orientation such that that axis direction is parallel to the rotational axis line of rotating body 182. Suction nozzles 172 are held by each of these nozzle holders 170, and positive pressure and negative pressure can be selectively supplied in the suction pipe thereof by the switching of switching valve device 190 provided to correspond to each of the twelve nozzle holders 170.

The twelve suction nozzles 172 are stopped consecutively at twelve stopping positions by rotating body 182 being intermittently rotated at angles equal to the distribution angle interval of nozzle holders 170. Also, suction nozzles 172 are raised and lowered while being rotated about the rotational axis line of rotating body 182 by cam surface 196 of cam 194 provided fixedly on head main body 180, roller 198 which forms a cam follower provided on the upper end section of nozzle holder 170, and compression coil spring 199 engaged with nozzle holder 170.

Due to this, the separation in the height direction of suction nozzles 172 from board holding device 22 at the twelve stopping positions is not the same for all, and the stopping position for which that distance is the shortest is the mounting position at which electronic circuit components are mounted on circuit board 40, and the high position for which that distance is the longest is the component imaging position; a stopping position in between this mounting position and component imaging position is the component takeout position at which electronic circuit components are taken out from the bulk component supply device which is described below. When an electronic circuit component is taken out from tape feeder 50 by suction nozzle 172, the mounting of electronic circuit components removed from both a tape feeder 50 and the bulk component supply device onto circuit board 40 is performed at the mounting position, and the mounting position is also the takeout mounting position.

Figure 6:
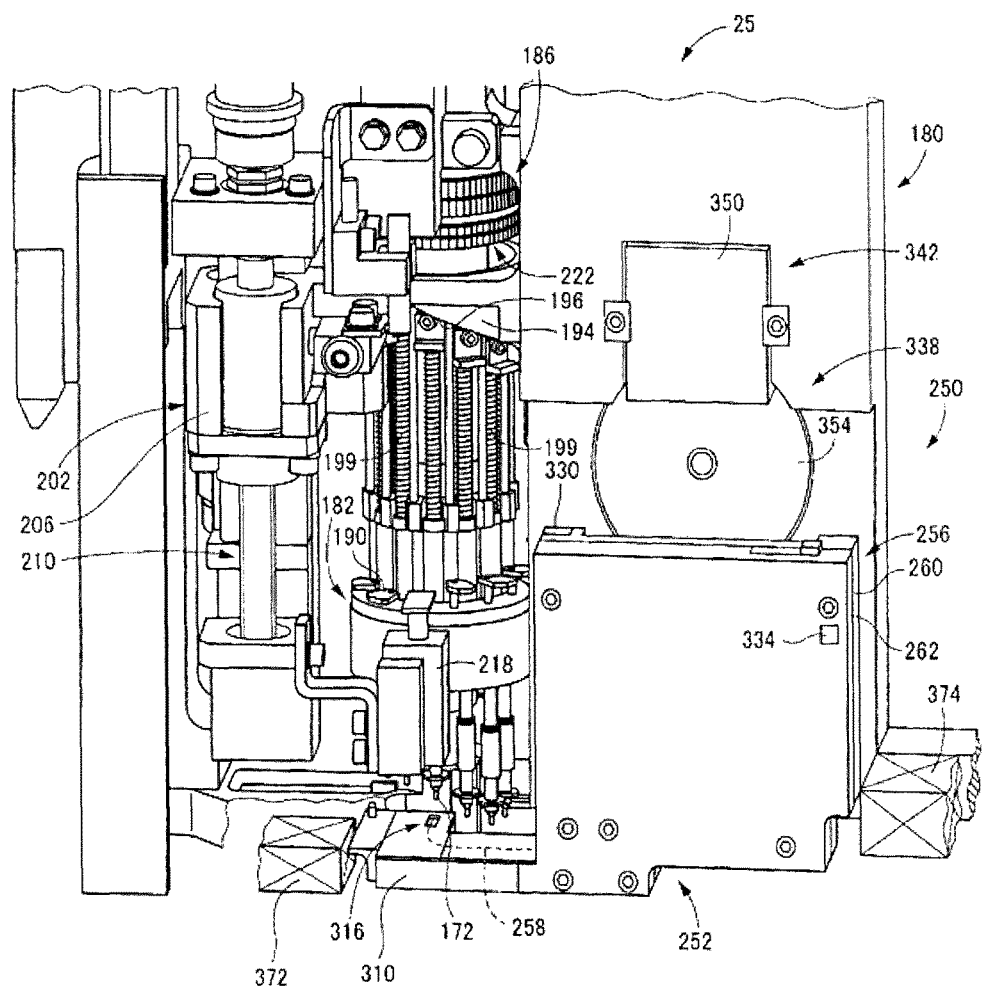
FIG. 6 This is a perspective view showing the area around the component takeout position of the above mounting head.

At each of the mounting position and the component takeout position, raising/lowering devices 200 and 202 are provided to raise/lower nozzle holders 170. Each of these raising/lowering devices 200 and 202, as shown in FIG. 5 and FIG. 6, includes raising/lowering members 204 and 206, transfer screw mechanisms 208 and 210, and electric motors 212 and 214. On each of the mounting position and component takeout position, as shown for the component takeout position in FIG. 6, valve switching device 218 is provided, and switching is performed of switching valve device 190 provided for the suction nozzle 172 which is stopped at the mounting position and the component takeout position.

Component imaging device 220 is provided at the component imaging position. Camera 221 of component imaging device 220 captures an image of an electronic circuit component taken out from tape feeder 50 or bulk component supply device 250 by suction nozzle 172 using a reflection device (omitted from figure). Also, nozzle holder rotational driving device 222 is provided on head main body 180 and rotates nozzle holders 170 around their own axis line. Nozzle holder rotational driving device 222 has electric motor 224 as a driving source and is a device which rotates all twelve nozzle holders 170 at the same time.

Further, mounting head control device 230 (refer to FIG. 15) is provided on head main body 180. Mounting head control device 230 is configured from mounting head control computer 232 as the main part, is connected to module control computer 122, and controls, among other things, electric motor 184 configured from a servo motor with an encoder. Each encoder 234 for electric motor 184 and so on which is shown as one representative example is connected to mounting head control computer 232.

This bulk component supply system 24 includes bulk component supply device 250. Bulk component supply device 250, as shown in FIG. 6, is provided with a section corresponding to the component takeout position of head main body 180, and is moved with respect to board holding device 22 together with mounting head 25 by head moving device 26. This bulk component supply device 250 includes passage-equipped component case 252 and bulk component transfer device 254. Passage-equipped component case 252, as shown in FIG. 7, includes bulk component base 256 (hereafter abbreviated to component case 256) and component passage 258 fixed to each other.

Figure 7:
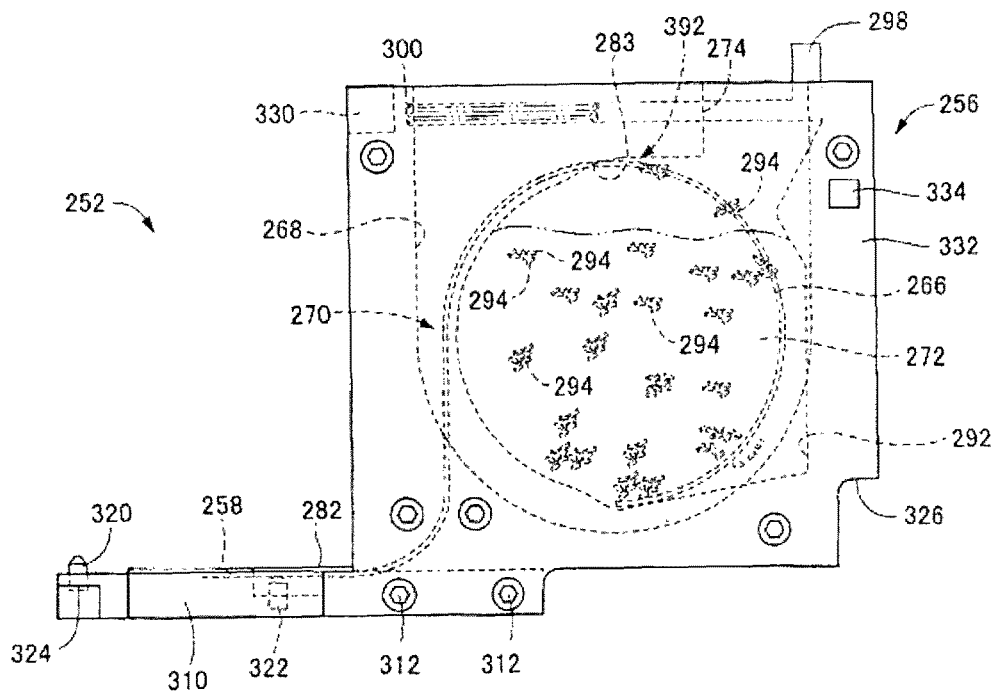
FIG. 7 This is a side view showing the passage-equipped component case of the bulk component supply device provided at the above component takeout position.
Figure 8:
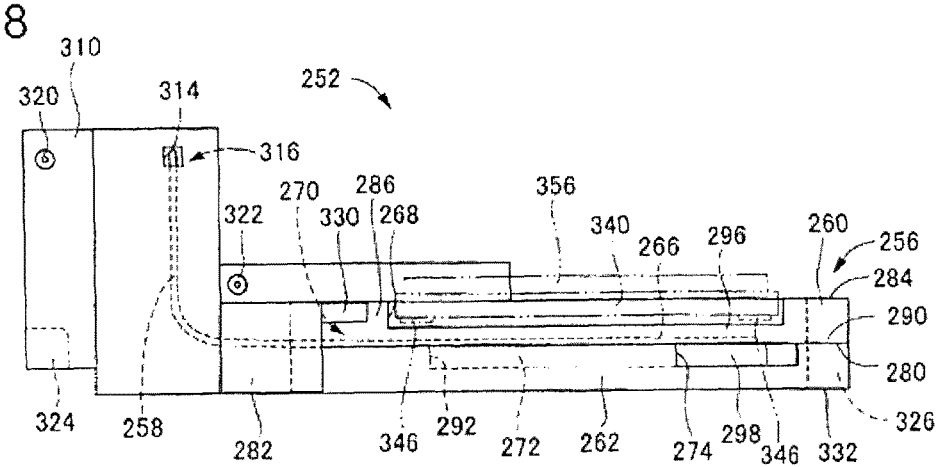
FIG. 8 This is a top view showing the above passage-equipped component case.

Component case 256, as shown in FIG. 7 and FIG. 8, includes case members 260 and 262 which are fixed fitting into each other, and is provided with guiding groove 266, concavity 268, guiding passage 270, housing chamber 272, and component inlet 274. Guiding groove 266 is formed into an annular section opened in opening surface 280 of case member 260 which faces case member 262; guiding passage 270 is formed from the covering by case member 262 and cover 282 of an annular section groove continuing from guiding groove 266 and a vertical groove. At the boundary section between guiding groove 266 and guiding passage 270 which is at the upper section housing chamber 272, drop-off section 283 is formed. Concavity 268 is formed opening between upper surface 286 and outside surface 284 which is the opposite surface to opening surface 280 of case member 260.

Housing chamber 272 is formed by the covering of concavity 292 which opens on the opening surface 290 of case member 262 by case member 260, and many components 294 are housed in a loosely packed state as bulk components. As component 294, leadless electronic circuit components which do not have leads are housed, for example, capacitors and resistors and the like, and components which have electrodes made from magnetic material (chip components) are housed. Housing chamber 272 and concavity 268 are divided by bottom wall section 296 of concavity 268. Component inlet 274 is provided at the upper section of case member 262, and components 294 enter through into housing chamber 272. Component inlet 274 opens and closes using shutter 298 which forms an opening/closing member. Shutter 298 is biased in the closed direction of component inlet 274 by compression coil spring 300.

Component passage 258, as shown in FIG. 7 and FIG. 8, is formed from block shaped passage forming body 310. Component case 256 is detachably fixed to passage forming body 310 by multiple bolts 312 which are a kind of fixing means, and after being fixed acts as an integrated passage-equipped component case 252. Component passage 258 is formed continuing from guiding passage 270, and in a state in which passage-equipped component case 252 is held on mounting head 25, the front end thereof has a shape which goes below suction nozzle 172 stopped at the component takeout position. Opening 314 is provided in the section corresponding to the front end of component passage 258 of passage forming body 310 such that takeout of components 294 is allowed, and the section including that opening 314 configures component supply section 316.

Protruding out on passage forming body 310 are multiple, for the present embodiment two, positioning pins 320 and 322. Positioning pins 320 and 322 are positioned differently in the X-axis direction and the Y-axis direction, and configure an installation positioning section provided vertically. Also on passage-equipped component case 252, in two locations separated in the front-rear direction thereof, downward facing engaging surfaces 324 and 326 are formed in each of the front section of passage forming body 310 and the rear section of case member 262 to configure a section to be engaged. In a state in which passage-equipped component case 252 is attached to head main body 180, the Y-axis direction is the front-rear direction, the component passage 258 side is the front side, and the component inlet 274 side is the rear side.

Further, on passage-equipped component case 252, RFID RF tag 330 is provided on outside surface 284 of case member 260. RF tag 330 is equipped with a communication section and a memory section; the type of component 294 housed in housing chamber 272 is memorized to form housed component type information holding section. Also, in surface 332 which is the opposite side to opening surface 290 of case member 262, two-dimensional code 334 is provided, and, for example, an identification number which forms identity information for identifying the type of component case 256 and the individual component case 256 is memorized.

Figure 9:
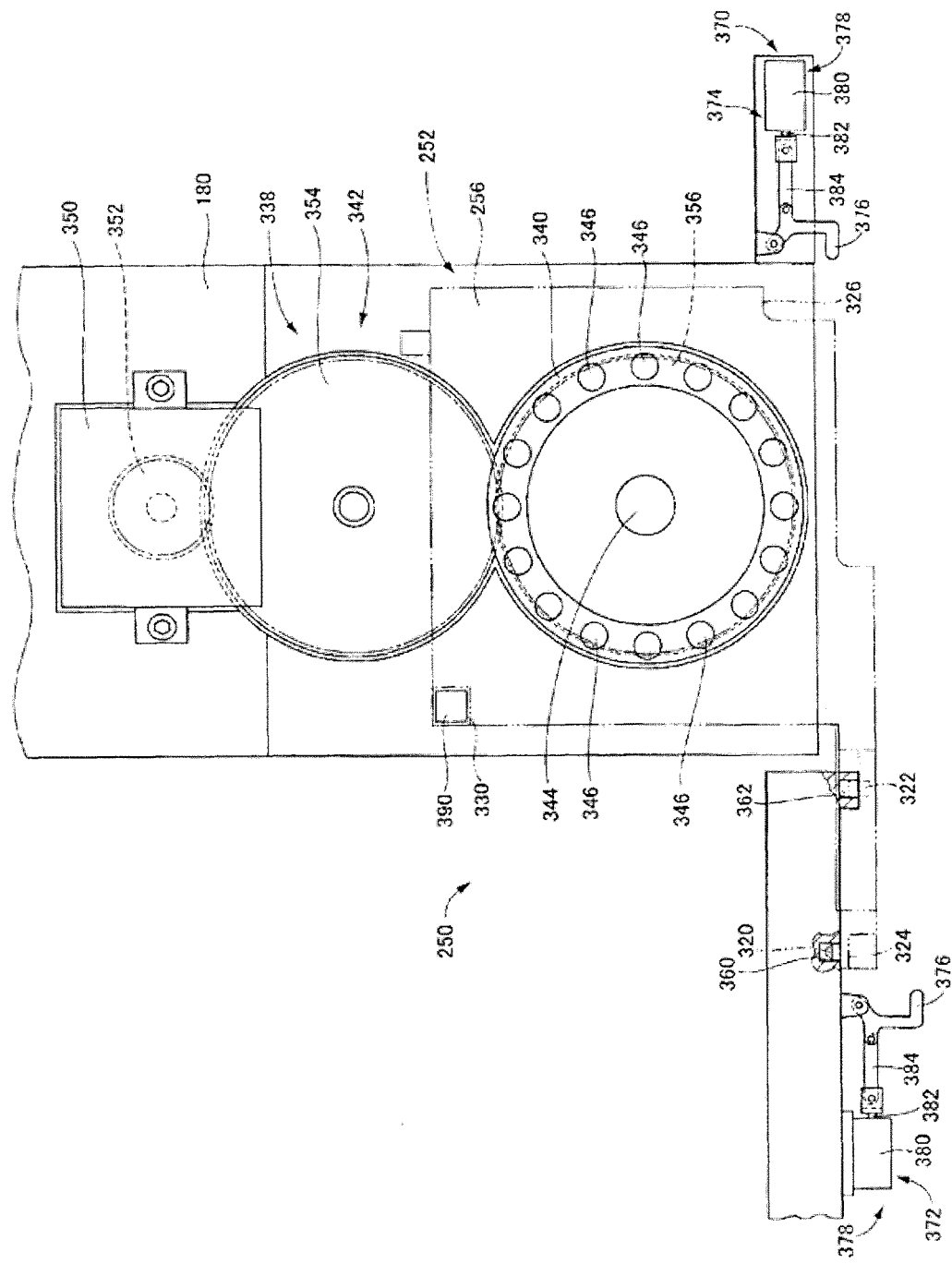
FIG. 9 This is a side view showing the bulk component driving device and passage-equipped component case attachment device of the above bulk component supply device, and showing the unclamped state of the passage-equipped component case attachment device.

The bulk component transfer device 254 includes bulk component driving device 338. This bulk component driving device 338 is provided on head main body 180 of mounting head 25. This bulk component driving device 338, as shown in FIG. 9, includes rotating disk 340 and rotating disk driving device 342. Rotating disk 340 is formed in a disk shape and is attached rotatably around an axis line parallel to the X-axis direction to head main body 180 by axis 344. On the side of rotating disk 340, multiple, for example, three or more permanent magnets 346 which form magnets, are held on the circumference centered around the rotational axis line the side of rotating disk 340 separated by suitably spaced intervals, which for the present embodiment are equal angle intervals. Rotating disk driving device 342 has as a driving source electric motor 350 provided above rotating disk 340, and the rotation thereof is transmitted via gears 352 and 354 to gear 356 fixed concentrically to rotating disk 340, such that rotating disk 340 can be rotated in both the forward and reverse directions to any angle. Also on head main body 180, two positioning holes 360 and 362 are formed opening on lower surface of head main body 180. Electromagnets may be used instead of permanent magnets.

Further provided on head main body 180 is passage-equipped component case attachment device 370. Passage-equipped component case attachment device 370, in this embodiment, includes pair of clamping devices 372 and 374. These clamping devices 372 and 374 are provided separated in the Y-axis direction, and as shown by one of the clamping devices 372, include clamping claw 376 which forms a holding member and clamping claw driving device 378 which forms a holding member driving device.

Clamping claw 376 is attached rotatably around an axis line parallel to the X-axis direction to head main body 180. Air cylinder 380 which forms the driving source of clamping claw driving device 378 is fixed to head main body 180, and one end of piston rod 382 of air cylinder 380 is linked to the other end of link 384 which is connected as to be relatively rotatable so that clamping claw 376 is relatively rotatable. By the expansion/contraction of piston rod 382: clamping claw 376 is moved to a clamp position in which clamping claw 376 engages with engaging surface 324 and holds passage-equipped component case 252 from below, as shown in FIG. 10; and clamping claw 376 is moved to an unclamp position in which clamping claw 376 separates from engaging surface 324, and as well as releasing passage-equipped component case 252, is retracted outside from the space under passage-equipped component case 252, as shown in FIG. 9.

Figure 15:
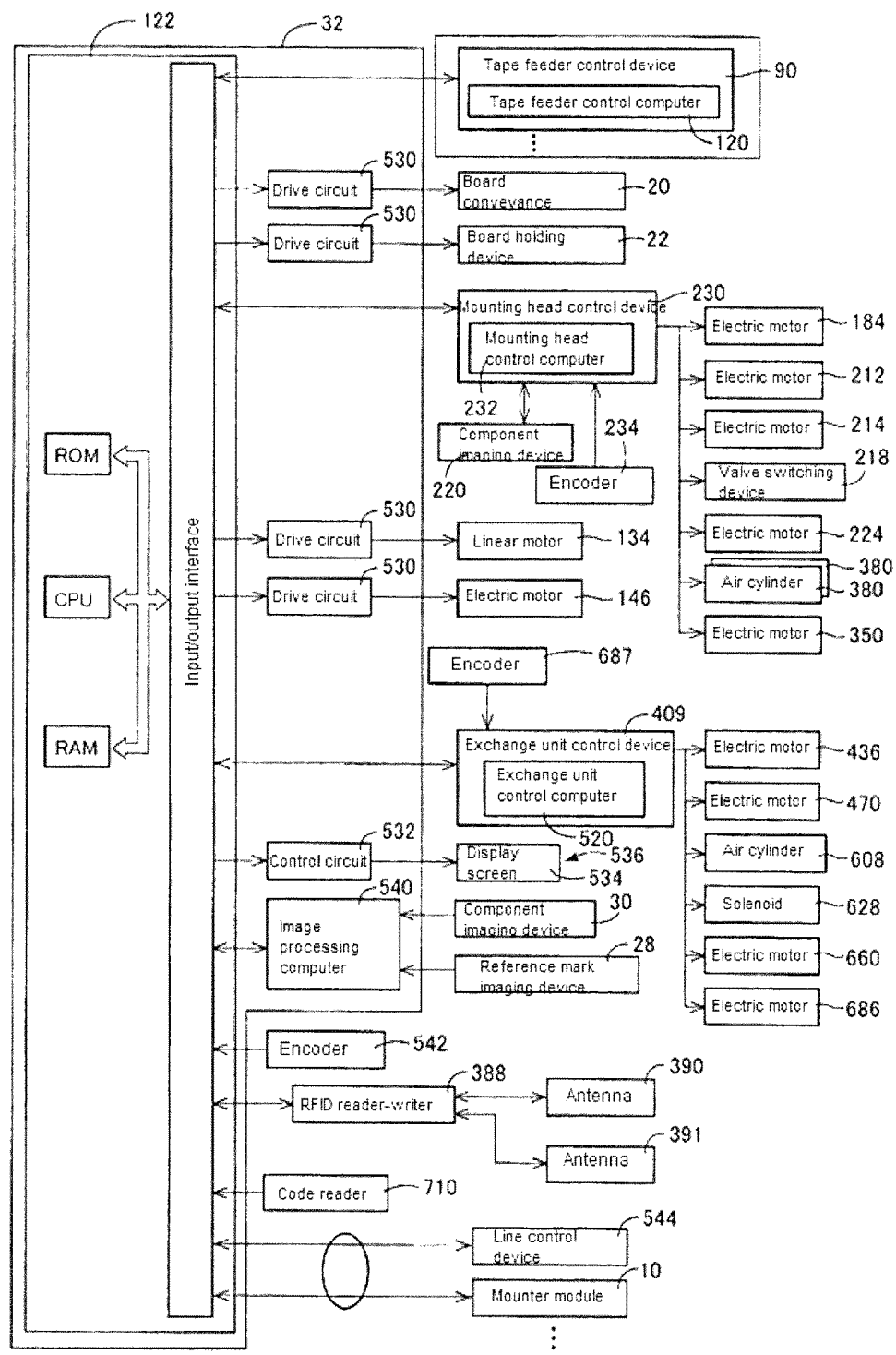
FIG. 15 This is a block diagram showing conceptually items such as the control device of the above mounter module.

Further, antenna 390 of RFID reader-writer 388 which forms an information acquisition device is provided on head main body 180. RFID reader-writer 388, as shown in FIG. 15, is equipped with separated type antenna 390, and that antenna 390 is provided on head main body 180, and is connected to the main body section of RFID reader-writer 388 by a connector and cord provided on mounting head 25.

Figure 10:
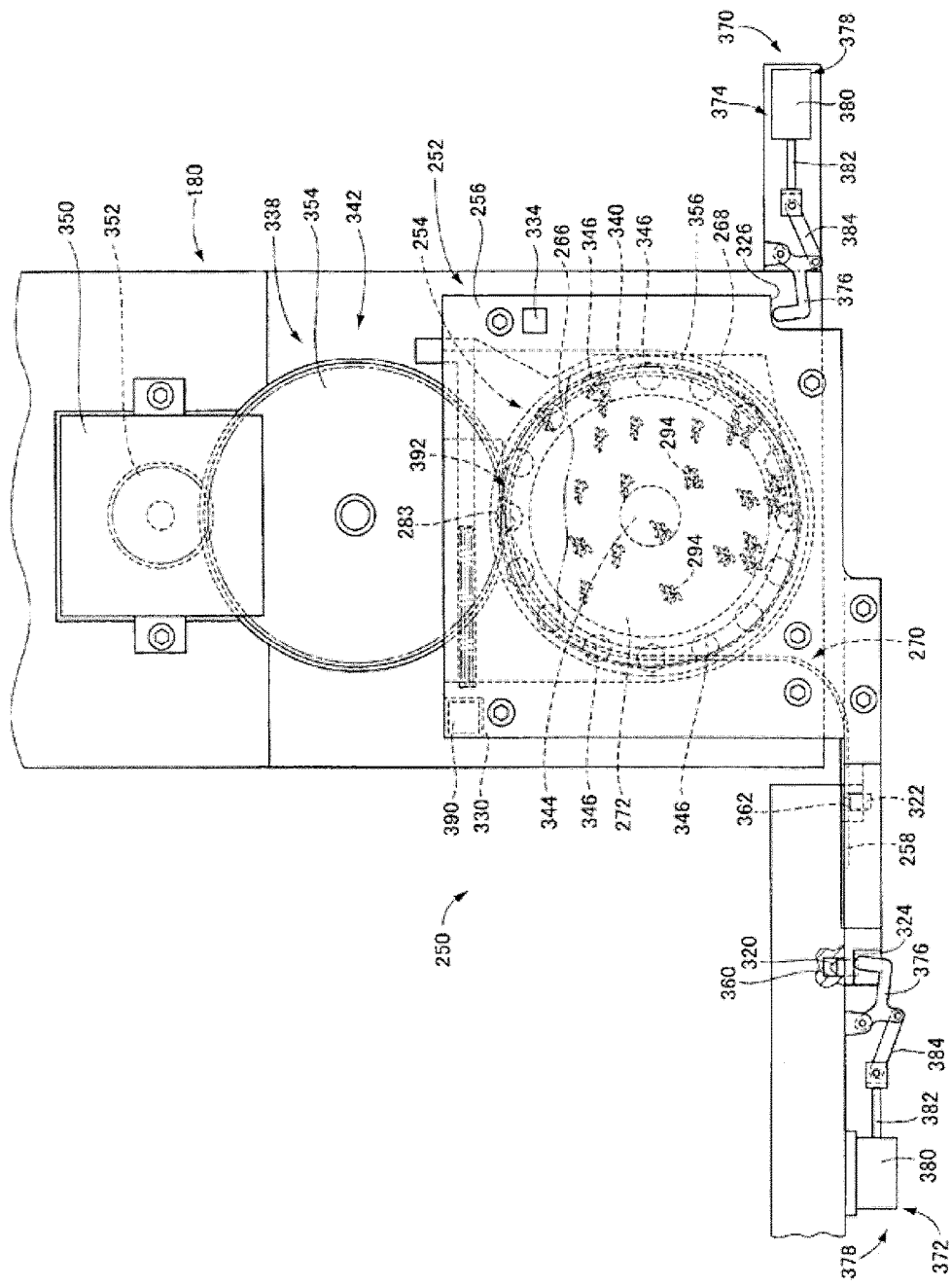
FIG. 10 This is a side view showing the clamped state of the above passage-equipped component case attachment device.

For passage-equipped component case 252, as shown in FIG. 10, positioning pins 320 and 322 are engaged with positioning holes 360 and 362 and positioned horizontally with respect to head main body 180. And, by each clamping claw 376 of clamping devices 372 and 374 being engaged with engaging surface surfaces 324 and 326, passage forming body 310 is contacted against head main body 180, such that passage-equipped component case 252 is held positioned vertically with respect to head main body 180. In that state, rotating disk 340 is engaged in concavity 268, and the state is such that the center of a circle defined by the arc of guiding groove 266 matches the rotational axis line of rotating disk 340. Due to this, in accordance with permanent magnets 346 being rotated by the rotation of rotating disk 340, as well as components 294 inside housing chamber 272 being picked up and moved from down to up by permanent magnets 346, a portion of components 294 are fitted into guiding groove 266, and enter into guiding passage 270 from guiding groove 266. However, it is not the case that all of the components 294 moved in accordance with the rotation of permanent magnets 346 can be fitted into guiding groove 266, and components 294 which are moved to near the boundary between guiding groove 266 and guiding passage 270 without being fitted into guiding groove 266 are dropped off by drop-off section 283 and fall into housing chamber 272. Meanwhile, components 294 which entered into guiding passage 270 soon enter into component passage 258, and move to component supply section 316 in a state arranged in a line. Although omitted from the figures, the air inside component passage 258 is sucked by an air suction device to aid the movement of component 294 to component supply section 316.

As is clear from the above descriptions, bulk component arranging device 392 which sorts, arranges in a line, and makes enter into guiding passage 270 components 294 is configured from guiding groove 266 and drop-off section 283, and in the present embodiment, this arranging device 392 configures bulk component transfer device 254 which acts together with the bulk component driving device 338 configured from the above rotating disk 340 and rotating disk driving device 342 to transfer components 294 to component passage 258 via guiding passage 270. Also, in the present embodiment, as well as passage-equipped component case 252 being able to be separated from bulk component driving device 338, it is attached such that it can be attached/removed to/from head main body 180 by passage-equipped component case attachment device 370, such that exchange is possible, with passage-equipped component case 252 being removed from head main body 180 and a different passage-equipped component case 252 being attached.

With passage-equipped component case 252 in a clamped state as above, RF tag 330 of passage-equipped component case 252 can perform communication with RFID reader-writer 388 via antenna 390 fixed on head main body 180. By passage-equipped component case 252 being released by clamping devices 372 and 374 and moved down with respect to head main body 180, positioning pins 320 and 322 are removed from positioning holes 360 and 362. Also, rotating disk 340 is removed from concavity 268 and passage-equipped component case 252 can be removed from head main body 180 with all of bulk component driving device 338 remaining on head main body 180 and in a state held as is on mounting head 25.

Figure 11:
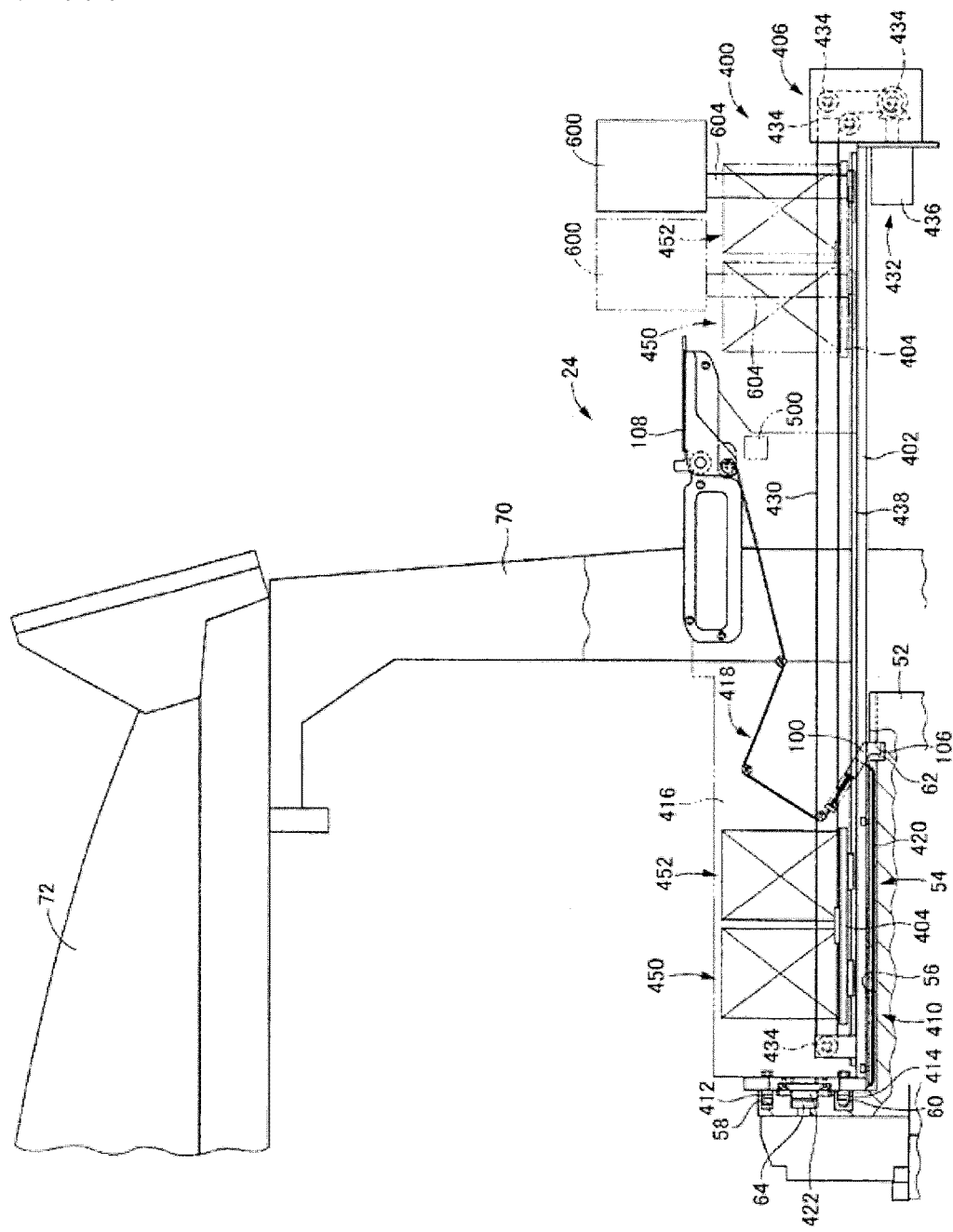
FIG. 11 This is a side view showing the passage-equipped component case exchange unit which exchanges the above passage-equipped component case.

This bulk component supply system 24 also includes passage-equipped component case exchange unit 400 (hereafter abbreviated to exchange unit 400) which forms a bulk component case exchange unit. This exchange unit 400, as shown in FIG. 11, includes: exchange device main body 402; slide 404 acting as a moving member which forms a movable member; slide driving device 406 which forms a movable member driving device and passage-equipped component case exchange device 408 (refer to FIG. 13) which forms bulk component case exchange device; and exchange unit control device 409 (refer to FIG. 15); and in this component mounter device is attached to the above component supply table 52.

Exchange device main body 402 is attached to component supply table 52 by passage-equipped component case exchange unit attachment device 410 which forms a bulk component case exchange unit attachment device. Passage-equipped component case exchange unit attachment device 410 has the same configuration as the above tape feeder attachment device 116, and includes: positioning pins 412 and 414 provided on the front of the front end which is an end on the lengthwise direction of exchange device main body 402; engaging device 418 provided on side plate 416 of exchange device main body 402 and rail 420 provided on the lower surface of exchange device main body 402; and is fixed to component supply table 52 by being attached to any one of the multiple installation sections 54. By releasing the engagement by engaging device 418, exchange unit 400 can be removed from component supply table 52 attached to module main body 18, such that exchange unit 400 can be attached/removed to/from module main body 18. Connector 422 is also provided on the front of exchange device main body 402 and is connected to connector 64. For the exchange unit 400 attached to component supply table 52, the front thereof is positioned inside a space inside the module; the rear thereof protrudes from the front of mounter module 10.

Slide driving device 406, in the present embodiment, includes endless belt 430 and belt moving device 432. Belt 430, as well as being wound around multiple pulleys 434, is engaged with slide 404, and belt 430 is moved by one of the multiple pulleys 434 being rotated by electric motor 436, such that slide 404 is moved in the Y-axis direction while being guided along guide rail 438 which forms a guiding member attached to exchange device main body 402. Multiple pulleys 434 and electric motor 436 and so on configure belt moving device 432.

Figure 12:
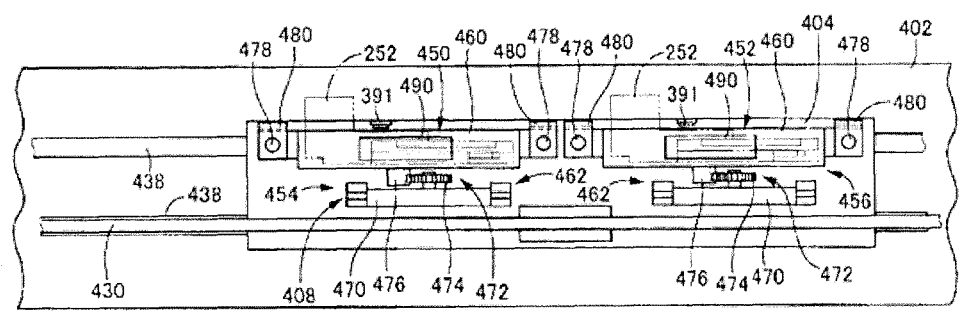
FIG. 12 This is a top view showing items such as the passage-equipped component case exchange device of the above passage-equipped component case exchange unit.
Figure 13:
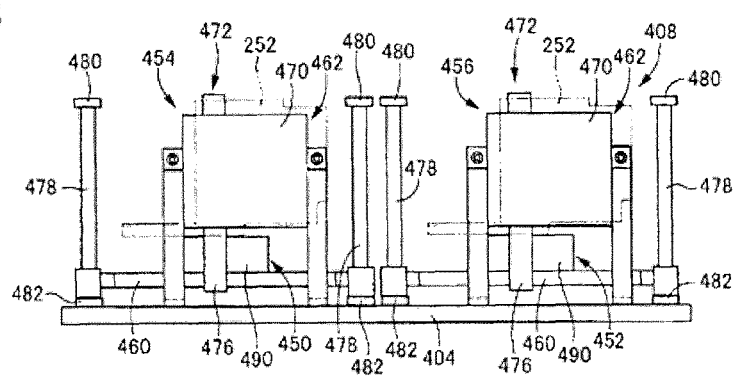
FIG. 13 This is a side view showing items such as the passage-equipped component case exchange device of the above passage-equipped component case exchange unit.

Slide 404 is equipped with case holding sections 450 and 452. Passage-equipped component case exchange device 408, as shown in FIG. 12 and FIG. 13, includes case holding section raising/lowering devices 454 and 456 which for case holding section driving devices for raising/lowering respectively case holding sections 450 and 452. Raising/lowering devices 454 and 456 are provided lined up in a direction parallel to the moving direction of slide 404; the configuration is the same so one of the raising/lowering devices 454 is described.

Figure 14:
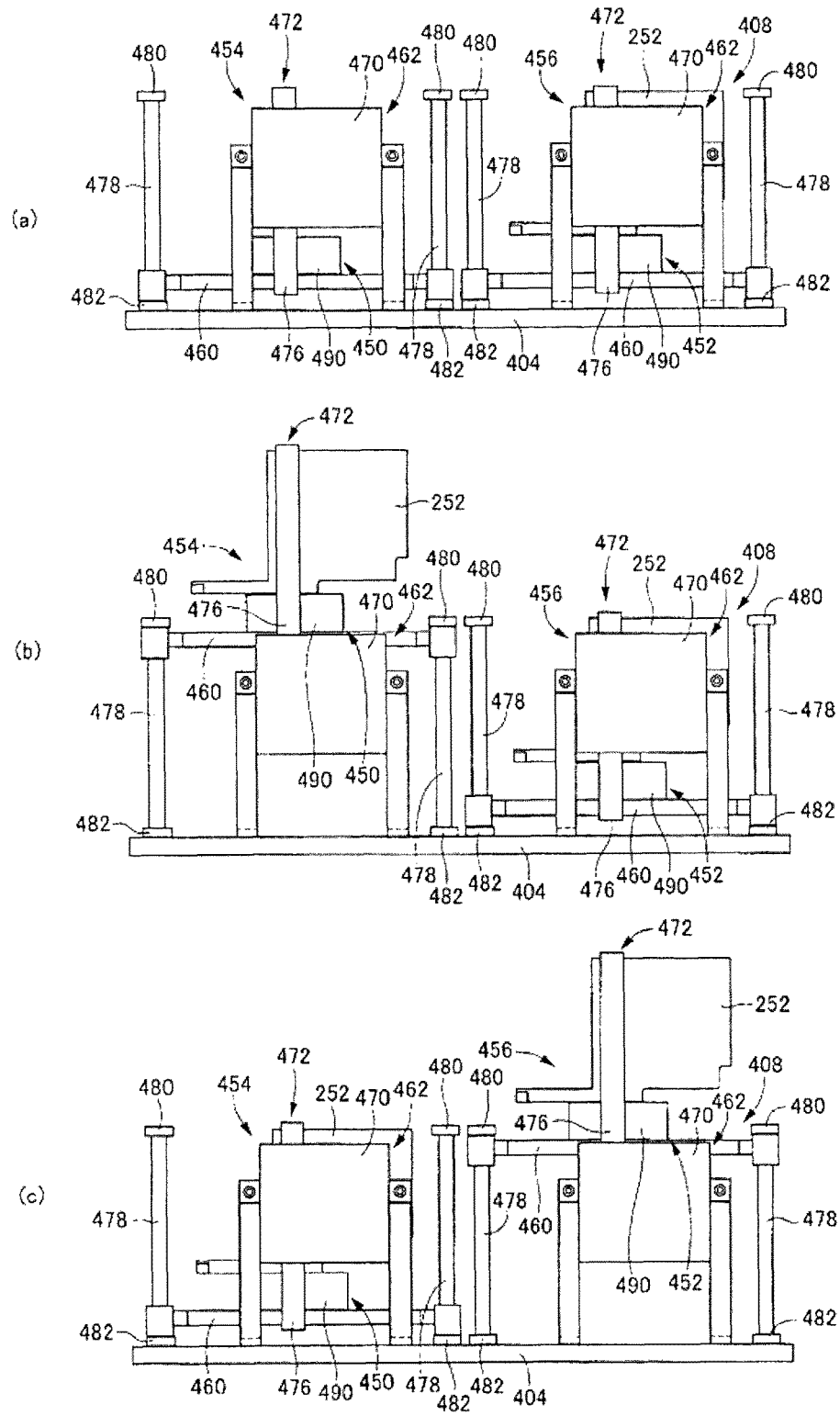
FIG. 14 These are drawings to illustrate the exchange of component cases by the above passage-equipped component case exchange unit.

Case holding section raising/lowering device 454 includes raising/lowering member 460 which forms a moving member and raising/lowering member driving device 462 which forms a moving member driving member. Raising/lowering member driving device 462 includes electric motor 470 which forms a driving source, and movement conversion mechanism 472 for converting the rotation of electric motor 470 into linear movement. Movement conversion mechanism 472, in the present embodiment, includes: pinion 474 which is rotated by electric motor 470; and rack 476 which is fixed in the vertical direction to raising/lowering member 460 and is engaged with pinion 474; and rack 476 is raised/lowered by pinion 474 being rotated and, as shown in FIG. 14, raising/lowering member 460 is raised/lowered between an upper limit position and lower limit position while being guided by pair of guide rods 478 which form a guiding member. The raising/lowering limit positions of raising/lowering member 460 are defined by raising/lowering member 460 contacting stoppers 480 and 482 which are larger than guide rod 478 provided respectively at the ends of guide rod 478.

Case holding section 450 is provided on raising/lowering member 460, and case holding sections 450 and 452 are provided on slide 404 lined up in a direction parallel to the moving direction by the movement of slide 404. In the present embodiment, case holding section 450 includes: holding platform 490 on which passage-equipped component case 252 is loaded, and case positioning holding device (omitted from the figures); and detachably holds passage-equipped component case 252. The case positioning holding device, as well as positioning passage-equipped component case 252 in a horizontal direction, holds it with sufficient holding force, and is an item for which the holding is released by moving component case holding section 450 down with respect to passage-equipped component case 252 against the holding force.

Slide 404 is moved between a forward limit position and a rear limit position by slide driving device 406. The forward limit position, as shown by solid lines in FIG. 11, is the position at which case holding sections 450 and 452 are positioned at the front of exchange unit 400; the rear limit position, as shown by two-dash lines, is the position at which case holding sections 450 and 452 are positioned at the rear of exchange unit 400. In this mounter module 10 which includes exchange unit 400, the head moving region is a region in which mounting head 25 moves to case holding sections 450 and 452 of slide 404 which is moved to the forward limit position, with transferring of passage-equipped component case 252 able to be performed between those two case holding sections. It follows that, the rear limit position is the first position at which the two case holding sections 450 and 452 are positioned outside the head moving region; and the forward limit position is the second position at which the two case holding sections 450 and 452 are positioned inside the head moving region. Also, the region at which the front end of exchange unit 400 is positioned is the bulk component case exchange region at which exchange of passage-equipped component cases 252 is performed; the region at which the rear is positioned is the bulk component replenishment region at which replenishment of components 294 to bulk component case 256 is performed; and slide 404 is moved to the bulk component replenishment region and the bulk component case exchange region by slide driving device 406. In the present embodiment, the bulk component replenishment region is provided outside the head moving region and is provided outside mounter module 10. The forward limit position and rear limit position of slide 404 are respectively defined by stoppers which are omitted from the figures, and electric motor 436, in the present embodiment, does not have a stopping position control function.

Further, two-dimensional code 500 is provided on exchange unit 400 and configures an exchange unit information holding section. On two-dimensional code 500, for example, an identification number which forms identity information for identifying individual exchange units 400 is memorized, and is provided, for example, on side plate 416 of exchange device main body 402.

Exchange unit control device 409 is configured from exchange unit control computer 520 (refer to FIG. 15) as the main part, and controls electric motor 436 and so on. Computer 520 communicates with and is connected to module control computer 122 by connectors 422 and 64. Electric power supply is also performed via connectors 422 and 64.

Figure 16:
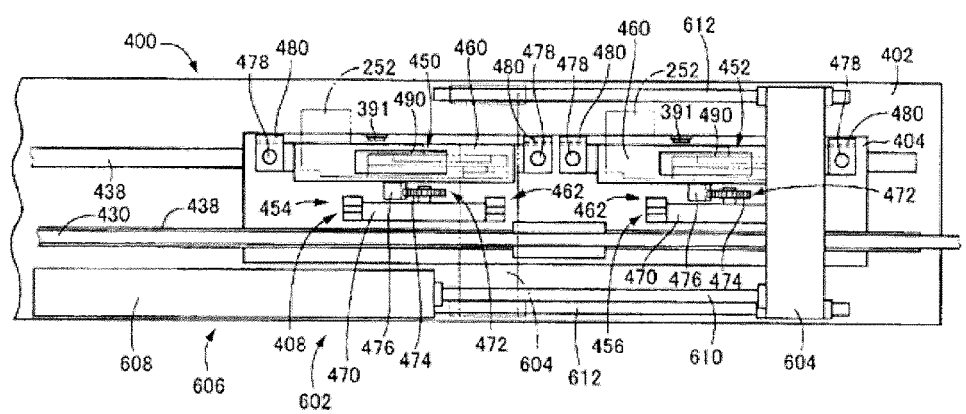
FIG. 16 This is a top view showing items such as the passage-equipped component case exchange device and the bulk component storage vessel moving device.

As shown in FIG. 11, bulk component storage vessel 600 (hereafter abbreviated to storage vessel 600) is provided on the rear end section of exchange unit 400 which is the section positioned in the bulk component replenishment region. This storage vessel 600 is moved in a direction parallel to the direction in which case holding sections 450 and 452 are lined up, which is the moving direction of slide 404, by bulk component storage vessel moving device 602 (hereafter abbreviated to storage vessel moving device 602). As shown in FIG. 16, this storage vessel moving device 602 includes moving platform 604 which forms a moving member and moving platform driving device 606 which forms a moving member driving device.

In the present embodiment, moving platform 604 forms a portal and is provided straddling the moving region of slide 404. In the present embodiment, moving platform driving device has air cylinder 608 as a driving source, and moving platform 604 is moved in the Y-axis direction guided by guide rail 612 by the expansion/contraction of piston rod 610 of air cylinder 608, and as shown by two-dash lines in FIG. 16, is positioned selectively at number one position which corresponds to case holding section 450 on the front side of slide 404 moved to the rear end position, and number two position which corresponds to case holding section 452 at the rear shown by solid lines. In the present embodiment, these positions are decided by the stroke end of the piston of air cylinder 608. It should be noted that in FIG. 11, moving platform driving device 606 is omitted to avoid the configuration being hard to understand.

Figure 17:
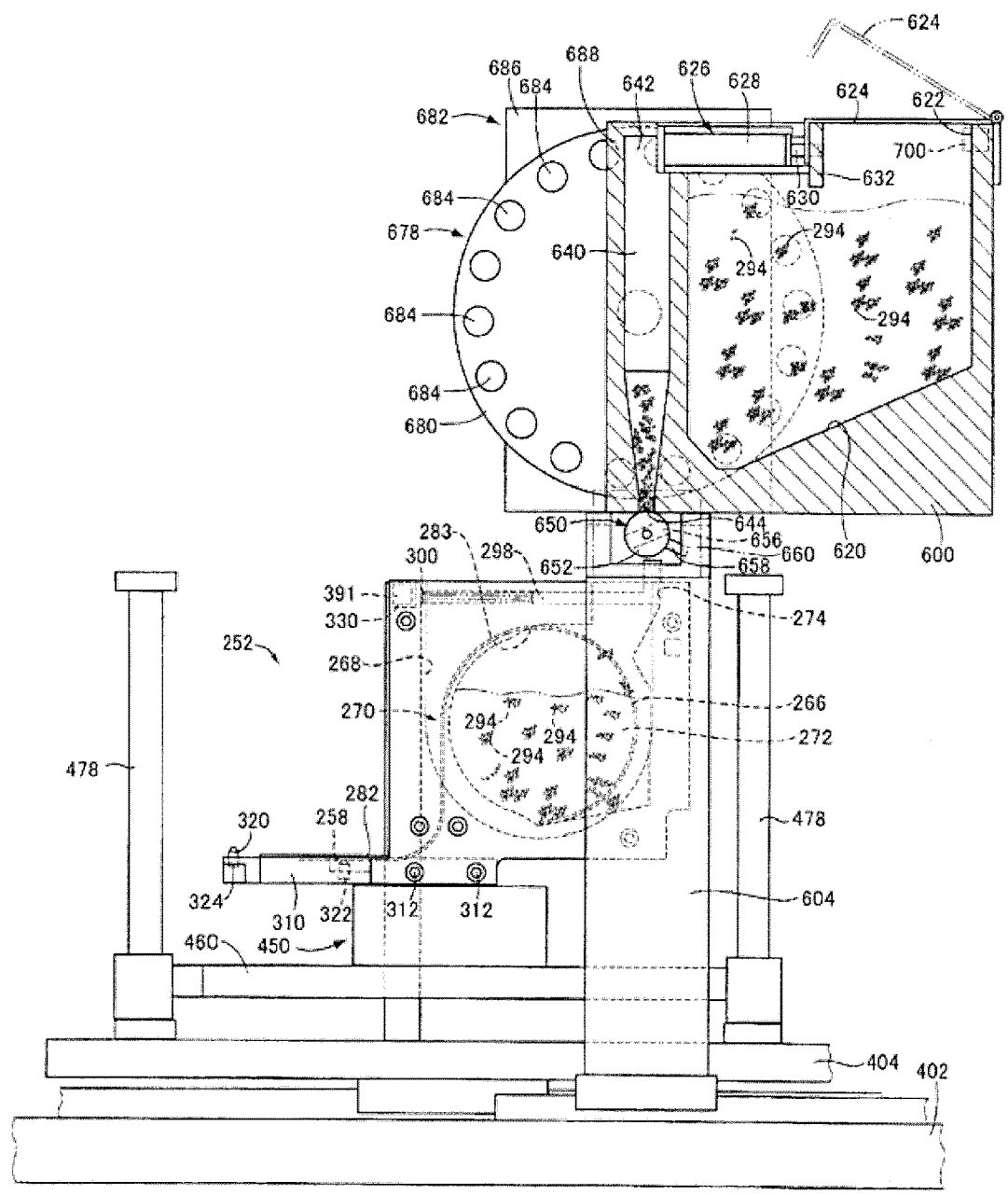
FIG. 17 This is a side view (partial cross section) showing the state in which the bulk component storage vessel is positioned with respect to the above passage-equipped component case.

As shown in FIG. 17, storage vessel 600 includes storage chamber 620 which is detachably attached to moving platform 604. Storage chamber 620 has a larger capacity than housing chamber 272 of component case 256 and stores component 294. Component inlet 622 is provided on the upper section of storage vessel 600 and component inlet 622 can be opened/closed with lid 624. Lid 624 is rotatably attached to storage vessel 600 and a closed state of component inlet 622 is maintained by lock device 626. This lock device 626 includes solenoid 628 and plunger 630. Plunger 630, by the excitation and demagnetization of solenoid 628, and is moved to: a lock position at which it straddles and is engaged with the free end of lid 624 and barrier wall 632 which demarcates component inlet 622 of storage vessel 600 and at which lid 624 is locked in a state positioned at a closed position where component inlet 622 is closed, as shown by solid lines is FIG. 17; and an unlock position in which it is disengaged from the free end of lid 624 and barrier wall 632 and at which lid 624 is allowed to be opened, as shown by two-dash lines. It should be noted that in FIG. 17 and FIG. 18, raising/lowering member driving device 462 is omitted to avoid the configuration being hard to understand.

Figure 18:
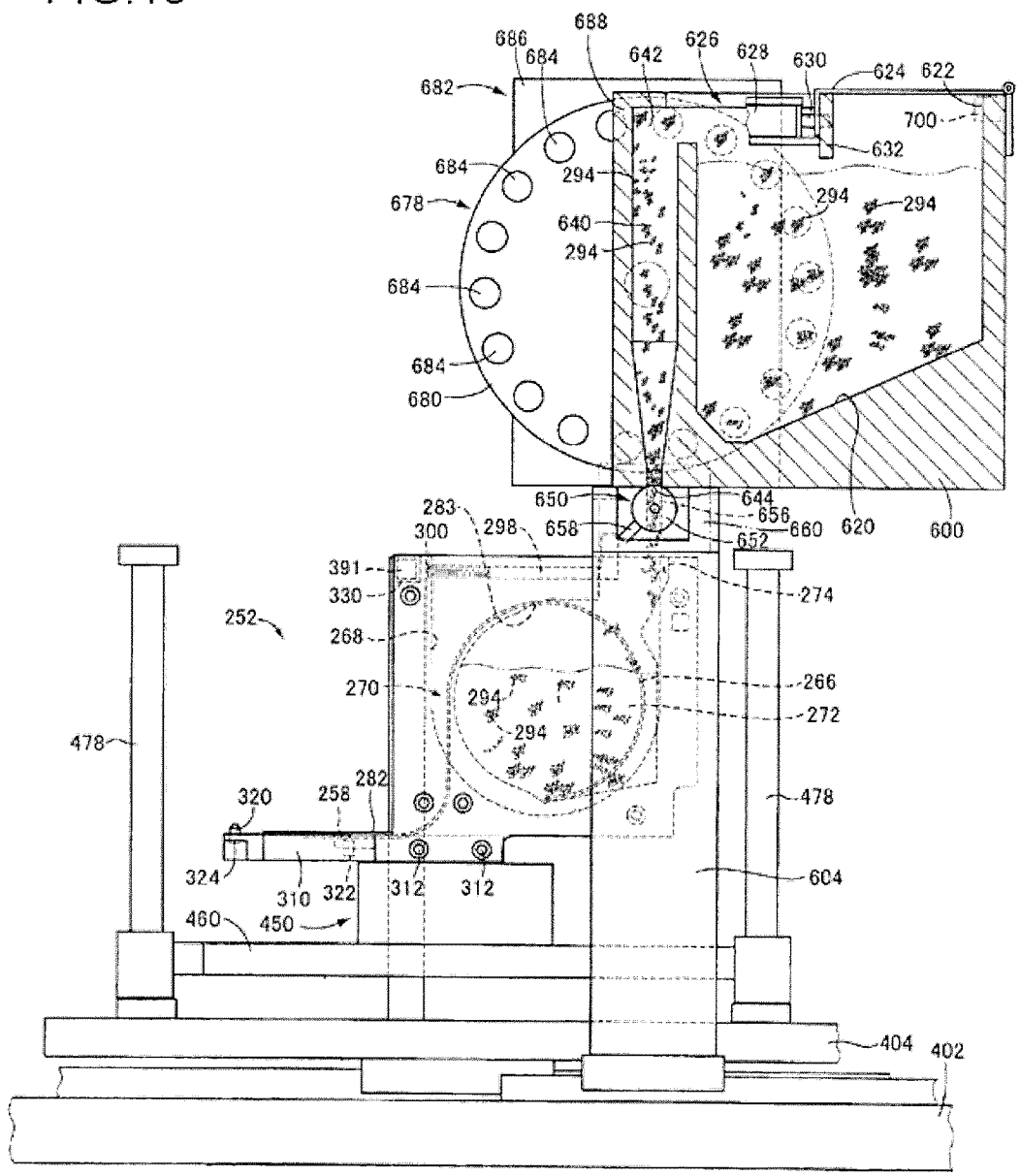
FIG. 18 This is a side view (partial cross section) showing the state in which the bulk component storage vessel is positioned with respect to the above passage-equipped component case and in which bulk components are being supplied.
Figure 19:
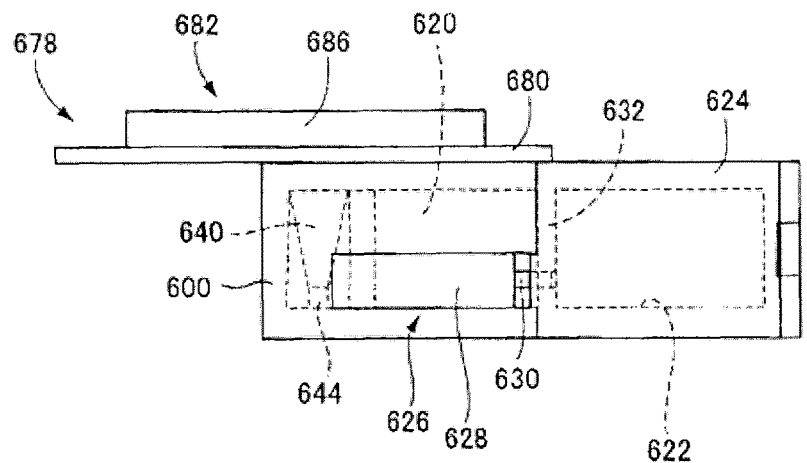
FIG. 19 This is a top view showing the above bulk component storage vessel.
Figure 20:
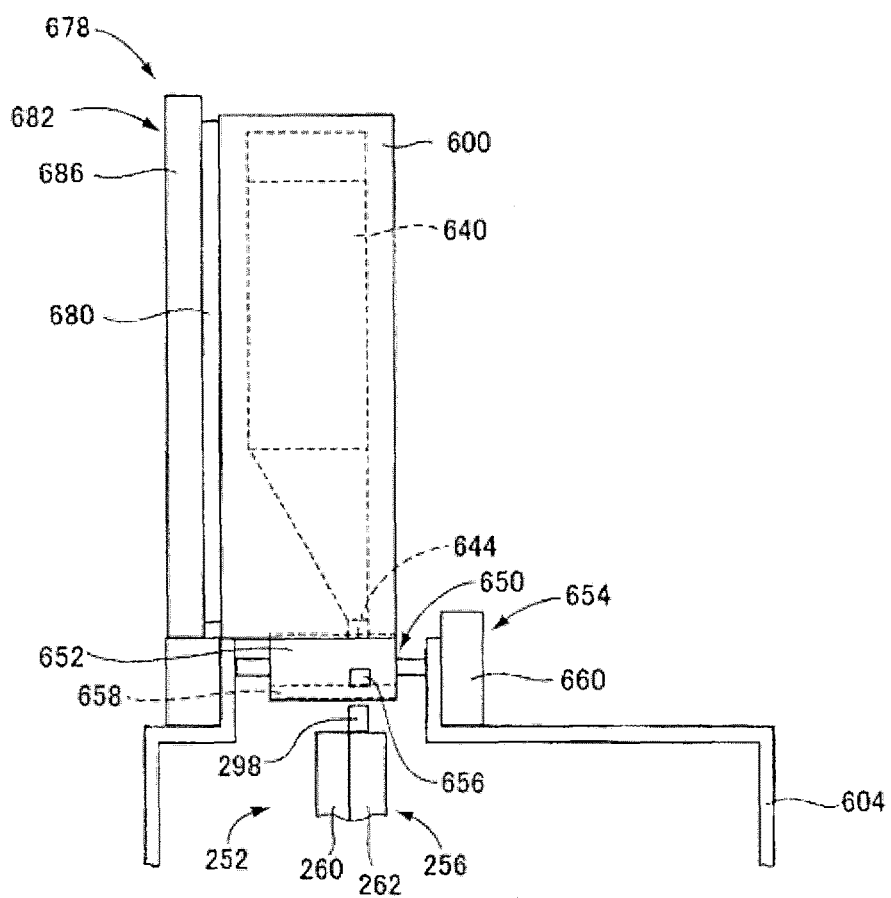
FIG. 20 This is a rear view showing the above bulk component storage vessel and connecting device.

Component outflow path 640 is also provided on storage vessel 600. Component outflow path 640 is provided in the vertical direction, and as shown in FIG. 18, the upper end of component outflow path 640 is connected to storage chamber 620 and configures inlet 642 of component outflow path 640. Component outflow path 640 is provided with outlet 644 which opens at the lower surface or bottom surface of storage vessel 600. In the present embodiment, outlet 644 is formed with a rectangular cross section shape, and as shown in FIG. 17, FIG. 19, and FIG. 20, the lower section of a side surface of component outflow path 640 is tilted towards outlet 644.

Outlet 644 is opened/closed by connecting device 650. As shown in FIG. 17, FIG. 20, connecting device 650 includes connecting member 652 and connecting member driving device 654. In the present embodiment, connecting member 652 is formed in a cylindrical shape, and is provided with connecting passage 656 which is rotatably attached to moving platform 604 and which extends in a direction perpendicular to the rotational axis line thereof. Connecting passage 656 is formed with a rectangular cross section. A plate-like driving section 658 which protrudes in a direction radially outwardly is also provided on connecting member 652.

In the present embodiment, connecting member driving device 654 is equipped with electric motor 660, connecting member 652 is rotated to: a blocked position at which connecting passage 656 is separated from outlet 644 and the outer circumference of connecting member 652 covers outlet 644 such that the connecting passage to component inlet 274 of component case 256 is blocked, as shown in FIG. 17; and a connected position in which connecting passage 656 is vertical and outlet 644 and component inlet 274 are connected, as shown in FIG. 18. These positions are decided by stoppers which are omitted from the figures.

Also, in the state in which connecting member 652 is in the blocked position, driving section 658 is positioned in a non-driving position which is above shutter 298 of component case 256, which allows relative movement between moving platform 604 and component case 256, and which allows shutter 298 to be positioned in a closed position with component inlet 274 closed. Driving section 658 is rotated together with connecting member 652, is engaged with shutter 298 and moved against the biasing force of spring 300, and open component inlet 274. In the state in which connecting member 652 is positioned at the connection position, driving section 658 is positioned at the driving position; positions shutter 298 at the open position; and maintains component inlet 274 in the open position. In the present embodiment, shutter 298 is configured from an opening/closing member of an opening/closing device which opens/closes component inlet 274, and the driving member driving device which drives driving member 658 which is the driving member of the opening/closing member driving device, and connecting member driving device 654 can share the same driving source, such that it is not necessary to provide a driving source for the opening/closing device on component case 256. Spring 300 which biases shutter 298 in the direction towards the closed position also configures the opening/closing member driving device.

Bulk component transfer device 678 is also provided on moving platform 604. Bulk component transfer device 678 includes rotating disk 680 and rotating disk driving device 682. Rotating disk 680 is provided adjacent to a side wall of storage vessel 600, and is rotatably attached around an axis line parallel to the widthwise direction of storage vessel 600, and multiple, for example 3 or more, magnets which form permanent magnets 684 are arranged at equal angle intervals along the circumference centered around the rotational axis line thereof. Rotating disk driving device has electric motor 686 as a driving source. In the present embodiment, electric motor 686 is configured from a servo motor and the rotational angle thereof is detected by encoder 687 (refer to FIG. 15).

Components 294 inside storage chamber 620 are pulled by each of the multiple permanents magnets 684 with the rotation of rotating disk 680, and are moved to component outflow path 640 by being moved from down to up. As shown in FIG. 18, components 294 which have reached inlet 642 of component outflow path 640 have their movement stopped be contacting against side wall 688 which is parallel to the rotational axis line of rotating disk 680 and which is the side wall demarcating component outflow path 640; and are released from being pulled by the relative rotation with respect to permanent magnets 684 and are scraped off to inlet 642, and transferred to component outflow path 640. In the present embodiment, side wall 688 is configured with a scraping off section of bulk component transfer device 678. This bulk component transfer device 678 configures a storage vessel use bulk component transfer device, and the bulk component transfer device 254 configures a supply device use bulk component transfer device.

Also, two-dimensional code 700 is provided on storage vessel 600 and configures a storage vessel related information holding section, and for example, an identification number which can individually identify storage vessel 600 is memorized therein.

Moving platform driving device 606, lock device 626, connecting device 650, and rotating disk driving device 682 are controlled by exchange unit control device 409. Exchange unit control device 409 is also an exchange/replenishment control device, and in the present embodiment storage vessel 600, storage vessel moving device 602, and devices provided together with those are provided on exchange device main body 402 together with items such as slide 404, slide moving device 406, passage-equipped component case exchange device 408, to form an integrated case exchange/component replenishment unit, and is attached/removed to/from module main body 18 by being attached/removed to/from component supply table 52. Also, on slide 404, an antenna 391 separate to the RFID reader-writer 388 is provided with respect to each case holding section 450 and 452.

Module control device 32 controls items such as various driving sources which configure mounter module 10 and linear motor 134 and so on via drive circuit 530, and controls display screen 534 via control circuit 532. Display device 536 which forms a reporting device is configured from control circuit 532 and display screen 534, and various information and so on is displayed via characters and diagrams and so on. For the reporting device, devices which report information and so on in various forms can be used such as lighting of lamps, flashing, sounding of a buzzer, announcements via recorded voice, and communication to a mobile terminal which an operator has.

Connected to the input/output interface of module control computer 122 are image processing computer 540 which processes data acquired from the images of reference mark imaging device 28 and component imaging device 30, encoder 542 (one is shown as a representative in FIG. 15) provided on items such as electric motor 146 of X-axis slide moving device 144, RFID reader-writer 388, tape feeder control computer 120, mounting head control computer 232 and exchange unit control computer 520, and so on. Note that, image data of component imaging device 220 of mounting head 25 is sent from mounting head control device 230 to image processing computer 540 via module control computer 122 and processed. And, required data is sent from module control computer 122 to mounting head control computer 232.

Also connected to input/output interface via a communication cable are module control device 32 of other mounter modules 10 and line control device 544 which controls overall the entire mounting line. Line control device 544 is configured from a host computer as the main part. Further, memorized on the RAM of module control computer 122 are various programs and data and so on for the mounting of electronic circuit components on circuit board 40.

In the mounter module 10 configured as above, as a form of mounting electronic circuit components on circuit board 40, mounting head 25 takes out electronic circuit components from both tape feeder 50 and bulk component supply device 50 and mounts them onto one circuit board 40. For this, passage-equipped component case 252 is held on mounting head 25 and tape feeder 50 and exchange unit 400 are attached to component supply table 52. This passage-equipped component case 252 is referred to as leading passage-equipped component case 252. Mounting head 25 is moved to tape feeder 50 by head moving device 26 when removing electronic circuit components from tape feeder 50; suction nozzle 172 is moved to the takeout mounting position by the rotation of rotating body 182 and then lowered to take out an electronic circuit component from tape feeder 50. Bulk component supply device 250 supplies components 294 while being moved together with mounting head 25; suction nozzle 172 which has reached the component takeout position by the rotation of rotating body 182 is lowered and component 294 is taken out from component supply section 316. In tape feeder 50, taped components 78 are transferred by transfer device 82 so that electronic circuit components are sent to component supply section 94; in bulk component supply device 250, components 294 are moved to component supply section 316 by the operation of bulk component driving device 338 and an air suction device; and each is put on standby for being taken out. Suction nozzle 172 holding an electronic circuit component is moved consecutively to a component imaging position and a mounting position, and after capturing an image of the holding orientation of the electronic circuit component, component 294 is lowered at the mounting position and mounted on circuit board 40. The attachment of an electronic circuit component to circuit board 40 by mounting head 25 is disclosed in the specifications of Japanese Patent Application 2011-206452, so detailed descriptions are omitted here.

If components 294 to be supplied run out in leading passage-equipped component case 252, leading passage-equipped component case 252 is exchanged with following passage-equipped component case 252 which is a different passage-equipped component case 252 to leading passage-equipped component case 252 and which is a passage-equipped component case 252 in which are housed components 294 to be supplied of the same type as those in leading passage-equipped component case 252. Following passage-equipped component case 252 is held by one of the two case holding sections 450 and 452 of exchange unit 400, and the other case holding unit is empty and does not hold a passage-equipped component case 252.

During exchange, slide 404 is positioned at the forward limit position which is in the bulk component case exchange region, and leading passage-equipped component case 252 is moved by mounting head 25 onto an empty case holding section, which in the example shown in FIG. 14 (a) is the front side case holding section 450. Here, raising/lowering member 460 is positioned at the lower limit position, and case holding section 450 is positioned at a retract position. Mounting head 25 is moved to a predetermined case transfer position with respect to empty case holding section 450. This position is a position at which leading passage-equipped component case 252 is held by case holding section 450 in a state positioned at a position specified in the X-axis direction and Y-axis direction.

After the movement of leading passage-equipped component case 252, as shown in FIG. 14 (b), raising/lowering member 460 is raised to the upper limit position, and case holding section 450 is raised to the case transfer position. This position is the position at which leading passage-equipped component case 252 is placed onto case holding platform 490, and leading passage-equipped component case 252 is held by a case positioning holding device. After holding, the clamping of leading passage-equipped component case 252 by clamping devices 372 and 374 is released, and then case holding section 450 is lowered to the retract position. By this, positioning pins 320 and 322 are removed from positioning holes 360 and 362, concavity 268 is separated from rotating disk 340, and leading passage-equipped component case 252 is removed from mounting head 25 with all of bulk component driving device 338 being held as is on mounting head 25. Bulk component arranging device 392 configured from guiding groove 266 and drop-off section 283 is in leading passage-equipped component case 252 and is removed from mounting head 25 together with leading passage-equipped component case 252.

After the removal of leading passage-equipped component case 252, mounting head 25 moves following passage-equipped component case 252 to a case transfer position specified in advance with respect to a case holding section, here case holding section 452. After movement, as shown in FIG. 14 (c), raising/lowering member 460 is raised to the upper limit position, and case holding section 452 holding following passage-equipped component case 252 is raised to the case transfer position. By this, as well as concavity 268 of following passage-equipped component case 252 being engaged with rotating disk 340, and positioning pins 320 and 322 being engaged with positioning holes 360 and 362, the section surrounding positioning pins 320 and 322 of passage forming body 310 are contacted against the lower surface of head main body 180. After the raising of case holding section 452, clamping claw 376 is rotated to the clamp position, and as well as leading passage-equipped component case 252 being held by mounting head 25 in a state positioned in a vertical direction and a horizontal direction, the state becomes such that moving force can be applied to components 294 inside housing chamber 272 in the direction of component passage 258 by bulk component driving device 338.

After following passage-equipped component case 252 is held by mounting head 25 and has become leading passage-equipped component case 252, case holding section 452 which was holding that passage-equipped component case 252 is lowered to the retract position and becomes an empty case holding section 452. Then, mounting head 25 recommences mounting onto circuit board 40 components 294 supplied from the new leading passage-equipped component case 252.

Meanwhile, on exchange unit 400, as shown in FIG. 17, slide 404 is moved to the rear limit position and is positioned in the bulk component replenishment region. In the bulk component replenishment region, moving platform 604 is positioned here at number one position, and outlet 644 of component outflow path 640 of storage vessel 600 is positioned above component inlet 274 of an empty leading passage-equipped component case 252 which is held on case holding section 450. As well as connecting member 652 being rotated to the connecting position in that state, driving section 658 moves shutter 298 of empty leading passage-equipped component case 252 held on case holding section 450 to the open position, and as shown in FIG. 18, component outflow path 640 and component inlet 274 are connected such that replenishment of components 294 is possible. In that state, as well as rotating disk 680 being rotated and components 294 being transferred from storage chamber 620 to component outflow path 640, components 294 flow into housing chamber 272 via outlet 644, connecting passage 656 and component inlet 274, such that leading passage-equipped component case 252 becomes following passage-equipped component case 252.

In the present embodiment, the component replenishment amount to housing chamber 272 is detected by the accumulative rotation angle which is the rotation amount of rotating disk 680. The quantity of components 294 pulled, moved by, and transferred to component outflow path 640 by the magnetic force of one permanent magnet 684 in accordance with the rotation of rotating disk 680 is acquired in advance; such that the quantity of components 294 flowed into component case 256 from the accumulative rotation angle of rotating disk 680 is acquired.

The component replenishment amount to housing chamber 272 is set at the maximum amount of the housing capacity of components 294 in housing chamber 272, and the accumulative rotation angle of rotating disk 680 is decided such that that specified amount of components 294 is flowed out from storage vessel 600. In the present embodiment, this maximum housing amount is set at an amount which does not obstruct the smooth entry of components 294 to guiding passage 270. Components 294 which are moved to near the boundary between guiding groove 266 and guiding passage 270 without being fitted into guiding groove 266 due to the rotation of of permanent magnets 346 in component case 256, are dropped off by drop-off section 283 and fall into housing chamber 272; and these dropped-off components 294 accumulate on the upper surface of the component layer shown by a two-dash line in FIG. 18. Because the movement freedom of these accumulated components 294 is easily restricted, it can be difficult for them to be fitted smoothly in guiding groove 266, and there are cases in which this also obstructs the smooth fitting of other components 294 into guiding groove 266; due to this components 294 no longer smoothly enter guiding passage 270, which gives rise to a situation in which components 294 do not arrive at component supply section 316. The height of accumulated components 294 becomes higher the greater the amount of housed components in housing chamber 272. Due to this, the maximum housing amount is set at an amount at which the fitting of components 294 into guiding groove 266 is not obstructed even when components 294 which do not fit into guiding groove 266 and which are dropped off and fall down accumulate on the upper surface of the component layer.

Rotating disk 680 is stopped after being rotated the specified accumulative rotation angle. Connecting member 652 is moved to the blockage position after rotating disk 680 stops and after sufficient time has elapsed for all of the components 294 transferred to component outflow path 640 to have dropped and entered component case 256. By this, as well as outlet 644 being closed, driving section 658 is moved to the non-driving position, and shutter 298 closes component inlet 274. In the present embodiment, the section of encoder 687 and exchange unit control computer 520 which acquire the accumulative rotation angle of rotating disk 680 configures the replenishment amount detection device; and the section which stops the rotation of rotating disk 680 in a state in which it has been rotated the specified accumulative rotation angle configures the automatic replenishment stopping device.

Then, slide 404 is moved to the forward limit position to be on standby for the exchange of passage-equipped component case 252 moved to the bulk component case exchange region. Next, when exchange of leading passage-equipped component case 252 and following passage-equipped component case 252 is performed, empty case holding section 452 receives the leading passage-equipped component case 252 from mounting head 25, and case holding section 450 which was holding following passage-equipped component case 252 and standing by delivers the following passage-equipped component case to mounting head 25. Case holding sections 450 and 452 are alternately number one case holding section and number two case holding section. As is clear from the above explanation, in the present embodiment, slide 404, slide driving device 406, and passage-equipped component case exchange device 408 configure the bulk component case moving device; the replenishment amount detection device, the automatic replenishment stopping device, connecting device 650, and storage vessel use bulk component transfer device 678 function as the component replenishment device; storage vessel 600 and bulk component storage vessel moving device 602 configures the component replenishment section; and two component cases 256 are provided with respect to one component replenishment section.

Exchange of passage-equipped component case 252 may be performed, for example, when an error occurs with the leading passage-equipped component case and component supply has become impossible.

During the above exchange of the leading passage-equipped component case 252 with the following passage-equipped component case 252, information is passed between module control computer 122, mounting head control computer 232 and exchange unit control computer 520, such that the raising and so on of case holding section 450 and 452 is performed at the specified timing.

In the present embodiment, supply of components 294 is performed as above, but if there is a mistake with any of the processes in this supply, a problem arises in that there is a risk that an unplanned component 294 will be mounted on circuit board 40 and a defective panel produced. Here, in the present embodiment, as given below, countermeasures are provided to prevent mistaken supply. As above, as information holding sections, two-dimensional code 334 and RF tag 330 are provided on passage-equipped component case 252, and two-dimensional code 500 and two-dimensional code 700 are provided respectively on exchange unit 400 and storage vessel 600 for that purpose; however, furthermore, a two-dimensional code is also provided on the component housing body of housing bags and housing cases which are sold housing components 294 which should be supplied to storage vessel 600, and code reader 710 is provided to function as an information acquisition device which reads component case related information, unit related information, storage vessel related information, component housing body related information and so on represented by these two-dimensional codes, with code reader 710 connected to module control computer 122 as shown in FIG. 15.

It should be noted that, depending on whether storage vessel 600 and passage-equipped component case 252 are each dedicated for one type of components, or are shared for multiple components, there is a division between cases in which the information of the information holding section which are the two-dimensional codes 700 and 334 and RF tag 330 provided thereon changes and cases in which the information does not change; whether writing needs to be possible is divided based on this as given below.

(1) Storage vessel 600 and passage-equipped component case 252 are both each dedicated for one type of component Writing of the information holding section is not necessary for both storage vessel 600 and passage-equipped component case 252.

(2) Storage vessel 600 is shared for all components, and passage-equipped component case 252 only is shared for multiple types of components The information holding section of storage vessel 600 is not essential, and writing must be possible of the information holding section of passage-equipped component case 252.

(3) Storage vessel 600 and passage-equipped component case 252 are both each shared for multiple types of components Writing must be possible of the information holding section of both passage-equipped component case 252 and storage vessel 600.

As an information section for which writing is possible, if commercially available writable paper labels are used, it is possible to use barcode labels and a barcode reader in all cases, but in the present embodiment, both non-writable two-dimensional codes 700, 334, and 500 and writable RF-tag 330 are used together as information holding sections. Also, in module control computer 122, as given above, a program for mounting electronic circuit components on circuit board 40 is memorized, and based on this, a component type/component case type/attachment and so deciding section which is also provided decides: the type of component 294 which should be supplied from exchange unit 400; the type of passage-equipped component case 252 appropriate for supplying that type of component 294 (information showing whether the item can house and supply components 294 of a given size and shape); and which out of the multiple installation sections 54 of component supply table 52 tape feeder 50 and exchange unit 400 should be attached to; and those results are displayed on display screen 534 of display device 536 such that an operator can perform attachment work of exchange unit 400, attachment work of passage-equipped component case 252 to exchange unit 400, and component supply work to storage vessel 600 according to the instructions on this display.

It should be noted that, it is also possible for storage vessel 600 to be able to use multiple types the same as passage-equipped component case 252, and although in this case the same type of instruction must be performed, in the present embodiment, because a storage vessel 600 which can be shared for use for all components 294 which are planned to be mounted on circuit board 40 is being used, an instruction for the type of storage vessel 600 is not performed. However, in a state in which components 294 are housed in storage vessel 600, it is necessary to individually identify storage vessels 600; and also in a state in which components 294 are housed in passage-equipped component case 252 and storage vessel 600 which are attached to exchange unit 400, it is necessary to individually identify exchange units 400; due to this, two-dimensional codes 700 and 500 which respectively include storage vessel identification information and unit identification information are provided.

When production starts of the target electronic circuit, first, exchange unit 400 is attached together with tape feeders 50 to the specified installation section 54 of component supply table 52 according to the instructions on the above display screen 534. In accordance with this, unit related information memorized on exchange unit control computer 520 is sent to module control computer 122, and based on this information a judgment is made as to whether exchange unit 400 is attached to the appropriate position; if the judgment result is "no", this fact is displayed on display screen 534 to instruct the operator to perform correction.

Before or after the attachment of exchange unit 400 to component supply table 52, as well as storage vessel 600 being attached to moving platform 604 thereof, passage-equipped component case 252 is held by case holding sections 450 and 452; at this time too, two-dimensional codes 700 and 334 of storage vessel 600 and passage-equipped component case 252 are read by code reader 710 and sent to module control computer 122, and a judgment is performed as to whether appropriate items are being held; and if an item is inappropriate, that fact is displayed on display screen 534 to instruct for correction.

When the above storage vessel 600 and passage-equipped component case 252 are attached to exchange unit 400, if both are empty, because there is no restriction on the type for storage vessel 600 and there is a restriction only on the type for passage-equipped component case 252, it is acceptable for code reader 710 to only read two-dimensional code 334 of passage-equipped component case 252. Conversely, in cases in which components 294 are already housed in storage vessel 600 or passage-equipped component case 252, it is necessary that those components 294 and newly replenished components 294 are the same type, so this fact must be checked. This checking is described below.

Continuing, components 294 are supplied to storage vessel 600 of exchange unit 400, and at this time too, the two-dimensional code provided on the component housing body is read by code reader 710, and a judgment is performed as to whether the components 294 which are being attempted to be supplied are the planned type; and if this judgment is "yes", information of this fact is sent to exchange unit control computer 520, and lock device 626 is released based on this information, and the operator can open lid 624 and supply components 294 of the component housing body to storage vessel 600. When supplying components from multiple component housing bodies, the operator is obliged to have the two-dimensional code of all the component housing bodies read by code reader 710.

After that, the specified amount of components 294 are supplied from storage vessel 600 to passage-equipped component case 252 being held on one of case holding sections 450 and 452. Here, information on the type of component 294 supplied is, together with identification information of passage-equipped component case 252, recorded on RF tag 330 of passage-equipped component case 252 by module control computer 122 via each of the two antennae 391 and RFID reader-writer 388 (refer to FIG. 15) provided on slide 404. Then, when passage-equipped component case 252 is delivered to mounting head 25, RF tag 330 information is read by RFID reader-writer 388 via antenna 390 provided on mounting head 25, and sent to module control computer 122; and there, a judgment is performed as to whether the components 294 supplied from the passage-equipped component case 252 delivered to mounting head 25 are the planned components. If the judgment result is that the components are not as planned, that fact is displayed on display screen 534 and mounting operation of mounter module 10 is prohibited.

In cases in which both storage vessel 600 and passage-equipped component case 252 are empty, because both are not registered as defective items and because the type of passage-equipped component case 252 is appropriate for components 294 being attempted to be supplied, storage vessel related information may include storage vessel identification information, and component case related information may include identification information and type information. Also, if defective items are removed in advance, identification information is not essential.

However, in actual fact, there are cases in which some components 294 are already housed in either one of storage vessel 600 and passage-equipped component case 252. In this case, storage vessel related information and component case related information must include at least one of identification information of storage vessel 600 and passage-equipped component case 252, or information of the type of component 294 being housed and so on therein. However, in cases in which related information only includes identification information, module control computer 122 or exchange unit control computer 520 must have memorized identification information and linked component type information. Either way, based on related information, it is necessary to obtain the identity of components 294 housed therein, and to confirm that that type of components matches the type of components 294 being attempted to be supplied, and matches the type of components 294 planned based on the mounting program; and if the type does not match, that fact is to be displayed on display screen 534. Also, for example, the replenishment of components 294 to passage-equipped component case 252 from storage vessel 600 may be prevented by not rotating rotating disk 680 of storage vessel use bulk component transfer device 678.

It follows that, actually, it is ideal for the type of component 294 housed in storage vessel 600 and passage-equipped component case 252 to be recorded in the related information holding section together with storage vessel identification information and component case identification information which can identify those individually. However, in the present embodiment, to simply the configuration, it is assumed that it is not feasible for different types of components 294 to be housed in storage vessel 600 and passage-equipped component case 252 attached to one exchange unit 400, so that information of the type of component 294 recorded in RF tag 330 of passage-equipped component case 252 is acquired, and that is taken as the type of component which is stored in storage vessel 600.

It should be noted that in cases in which the types of components 294 housed in storage vessel 600 and passage-equipped component case 252 are one type, it is acceptable if the storage vessel related information and component case related information include at least component type information.

In the above present embodiment, because components 294 are stored in storage vessel 600 with a large capacity, and are automatically supplied from there to passage-equipped component case 252 a specified amount at a time, there is the benefit that an operator need only perform the required component supply work a small number of times; but it is not essential to provide a storage vessel 600, and it is possible to have components 294 supplied directly from a component housing body to passage-equipped component case 252 by an operator. In this case, the two-dimensional code or the barcode representing the housing container related information and component case related information of the component housing body and passage-equipped component case 252 is read by code reader 710, and if it is inappropriate, that fact is displayed on display screen 534.

Also, the supply device use bulk component transfer device may, for example, as disclosed in Japanese Unexamined Patent Application Publication Number 2000-244186, be a device which encourages the ejection of bulk components housed in a bulk component case to a component passage by the up/down movement of an ejection encouraging member.

Further, the replenishment amount of bulk components from the bulk component storage vessel to the bulk component case may be detected based on the weight of the bulk component case or the bulk component storage vessel, or may be detected based on the height level of the layer of the bulk components housed in the bulk component case or the bulk component storage vessel. The weight, for example, may be detected by a load cell; and the height of the upper surface of the bulk component layer, for example, may be detected by a proximity switch or a photoelectric sensor.

The relative movement imparting device which imparts the relative movement on the substrate holding device and mounting head required for the mounting of bulk components to the circuit substrate may move both the mounting head and the substrate holding device.

REFERENCE SIGNS LIST

25: Mounting head
26: Head moving device
250: Bulk component supply device
400: Passage-equipped component case exchange unit
600: Component storage vessel

The invention claimed is:

1. A bulk component supply system comprising:
a bulk component supply device which is movable together with a mounting head for mounting bulk components on a circuit substrate, the bulk component supply device including:
  a bulk component case which houses electronic circuit components in a loosely packed state as bulk components,
  a component passage which arranges bulk components in a line and guides the bulk components to a component supply section, and
  a supply device use bulk component transfer device which transfers bulk components inside the bulk component case to the component passage; and
a bulk component case moving device to remove the bulk component case from the mounting head and move the bulk component case to a bulk component replenishment region,
wherein bulk components can be replenished to the bulk component case moved to the bulk component replenishment region,
wherein the bulk component supply system includes first and second bulk component cases,
wherein the bulk component case moving device includes a first case holding section which holds the first bulk component case removed from the mounting head, a second case holding section which holds the second bulk component case to which bulk components were replenished, a first case holding section raising and lowering device which raises and lowers the first case holding section, and a second case holding section raising and lowering device which raises and lowers the second case holding section, and
wherein the first bulk component case is received from the mounting head to the first case holding section by using the first case holding section raising and lowering device, and the second bulk component case is delivered to the mounting head from the second case holding section by using the second case holding section raising and lowering device.

2. The bulk component supply system according to claim 1, further comprising:
a bulk component storage vessel which stores bulk components, has a larger capacity than the second bulk component case, and is provided in the bulk component replenishment region; and
a component replenishment device which replenishes bulk components from the bulk component storage vessel to the first bulk component case moved to the bulk component replenishment region.

3. The bulk component supply system according to claim 2, further comprising:
a connecting device which replenishes bulk components by connecting a component inlet of the first bulk component case moved to the bulk component replenishment region and a component outflow path which outflows bulk components of the bulk component storage vessel; and
a storage vessel use bulk component transfer device which transfers the bulk components in the bulk component storage vessel to the component outflow path.

4. The bulk component supply system according to claim 2,
wherein the bulk component storage vessel is equipped with a storage vessel related information holding section which holds storage vessel related information including at least one of: (a) storage vessel identification information by which it is possible to individually identify the bulk component storage vessel itself; (b) storage vessel type information which is information of the type of the bulk component storage vessel itself; and (c) information of the type of the bulk component stored in the bulk component storage vessel;
wherein the first and second bulk component cases are each equipped with a component case related information holding section which holds component case related information including at least one of: (d) component case identification information which can individually identify the respective bulk component case itself; (e) information of the type of the respective bulk component case itself; and (f) information of the type of bulk components already housed in that respective bulk component case;
wherein the bulk component supply system further includes a storage vessel/component case information acquisition device which acquires: storage vessel related information of that storage vessel related information holding section; and component case related information of that component case related information holding section; and
wherein the bulk component supply system includes at least one of:
a storage vessel/component case not appropriate notification device which provides a notice when the storage vessel related information and the component case related information acquired by the storage vessel/component case information acquisition device is not appropriate; and
a replenishment prevention device which prevents replenishment of bulk components to the second bulk component case from the bulk component storage vessel when the storage vessel related information and the component case related information acquired by the storage vessel/component case information acquisition device is not appropriate.

5. The bulk component supply system according to claim 1, wherein the bulk component case moving device includes:
a movable member which is equipped with the first and second case holding sections and which is movable to the bulk component replenishment region and a bulk component case exchange region;
a movable member driving device which moves that movable member to the bulk component replenishment region and the bulk component case exchange region; and
a bulk component case exchange device which, at the bulk component case exchange region, receives and holds the first bulk component case from the mounting head using the first case holding section, and delivers the second bulk component case to the mounting head using the second case holding section.

6. The bulk component supply system according to claim 1,
wherein the first and second bulk component cases are each equipped with a component case related information holding section which holds component case related information including at least one of: (a) component case identification information which can individually identify the respective bulk component case itself; (b) information of the type of the respective bulk component case itself; and (c) information of the type of bulk components already housed in that respective bulk component case;

wherein the mounting head is equipped with a component case related information acquisition device which acquires component case related information of the component case related information holding section; and wherein the bulk component supply system further includes at least one of:

an unplanned component case notification device which provides a notice when the component case related information acquired from the component case related information acquisition device is different to planned component case related information; and a mounting operation prohibition section which prohibits component mounting operation of a component mounter device provided with the bulk component supply system when the component case related information acquired from the component case related information acquisition device is different to the planned component case related information.

* * * * *